(12) United States Patent
Ying et al.

(10) Patent No.: US 8,587,307 B2
(45) Date of Patent: Nov. 19, 2013

(54) SYSTEMS AND METHODS FOR ACCELERATING THE ACQUISITION AND RECONSTRUCTION OF MAGNETIC RESONANCE IMAGES WITH RANDOMLY UNDERSAMPLED AND UNIFORMLY UNDERSAMPLED DATA

(75) Inventors: Lei Ying, Milwaukee, WI (US); Dong Liang, Milwaukee, WI (US)

(73) Assignee: UWM Research Foundation, Inc., Milwaukee, WI (US)

(*) Notice: Subject to any disclaimer, the term of this patent is extended or adjusted under 35 U.S.C. 154(b) by 668 days.

(21) Appl. No.: 12/833,355

(22) Filed: Jul. 9, 2010

(65) Prior Publication Data

US 2011/0006768 A1  Jan. 13, 2011

Related U.S. Application Data

(60) Provisional application No. 61/224,350, filed on Jul. 9, 2009.

(51) Int. Cl.
*G01R 33/56* (2006.01)

(52) U.S. Cl.
USPC .......................................... 324/309; 324/307

(58) Field of Classification Search
USPC .......................... 324/300–322; 600/407–435; 382/128–131, 276, 278
See application file for complete search history.

(56) References Cited

U.S. PATENT DOCUMENTS

| | | | |
|---|---|---|---|
| 7,319,324 B2* | 1/2008 | Kannengießer et al. | 324/309 |
| 7,330,602 B2* | 2/2008 | Lee et al. | 382/278 |
| 7,348,776 B1* | 3/2008 | Aksoy et al. | 324/307 |
| 7,418,287 B2* | 8/2008 | Tsao et al. | 324/309 |
| 7,439,739 B2* | 10/2008 | Beatty | 324/309 |
| 7,545,966 B2* | 6/2009 | Lewin et al. | 382/128 |
| 7,602,183 B2* | 10/2009 | Lustig et al. | 324/309 |
| 7,777,487 B2 | 8/2010 | Ying et al. | |
| 7,800,368 B2* | 9/2010 | Vaughan et al. | 324/318 |
| 8,063,637 B2* | 11/2011 | Xu et al. | 324/314 |
| 8,170,305 B2* | 5/2012 | Laidlaw et al. | 382/128 |
| 8,170,311 B2* | 5/2012 | Ying | 382/128 |
| 8,538,115 B2* | 9/2013 | Zhang et al. | 382/131 |
| 2005/0074152 A1* | 4/2005 | Lewin et al. | 382/128 |
| 2005/0174113 A1* | 8/2005 | Tsao et al. | 324/307 |

(Continued)

OTHER PUBLICATIONS

Block K.T. et al., "Undersampled Radial MRI with Multiple Coils. Iterative Image Reconstruction Using a Total Variation Constraint" Magnetic Resonance in Medicine 57(6):1086-98 (Jun. 2007).

(Continued)

*Primary Examiner* — Melissa Koval
*Assistant Examiner* — Tiffany Fetzner
(74) *Attorney, Agent, or Firm* — Michael Best & Friedrich LLP

(57) ABSTRACT

A method and system of accelerating the acquisition and reconstruction of magnetic resonance images. Magnetic resonance imaging ("MRI") data is acquired from a plurality of coils using parallel MRI ("pMRI"). The MRI data represents a reduced field-of-view ("FOV") image for each of a plurality of coils. The MRI data is further undersampled by sequentially applying a compressed sensing ("CS") technique, such as SparseMRI. The undersampled, reduced FOV images are then reconstructed into a final magnetic resonance image using a pMRI reconstruction technique, such as SENSitivity encoding ("SENSE"). This combination of MR image acquisition, sampling, and reconstruction is referred to as CS-SENSE.

16 Claims, 14 Drawing Sheets

(56) References Cited

U.S. PATENT DOCUMENTS

| | | | |
|---|---|---|---|
| 2005/0187458 A1* | 8/2005 | Kannengiesser et al. | 600/410 |
| 2006/0062486 A1* | 3/2006 | Lee et al. | 382/276 |
| 2008/0054899 A1* | 3/2008 | Aksoy et al. | 324/307 |
| 2008/0129298 A1* | 6/2008 | Vaughan et al. | 324/322 |
| 2008/0197842 A1* | 8/2008 | Lustig et al. | 324/307 |
| 2008/0205733 A1* | 8/2008 | Laidlaw et al. | 382/131 |
| 2009/0274356 A1 | 11/2009 | Ying | |
| 2010/0142794 A1* | 6/2010 | Gardi et al. | 382/133 |
| 2010/0264926 A1* | 10/2010 | Xu et al. | 324/313 |
| 2011/0006768 A1* | 1/2011 | Ying et al. | 324/309 |
| 2011/0142316 A1* | 6/2011 | Wang et al. | 382/131 |
| 2011/0241676 A1* | 10/2011 | Busse et al. | 324/309 |
| 2011/0241677 A1* | 10/2011 | Busse et al. | 324/309 |
| 2012/0155730 A1* | 6/2012 | Metaxas et al. | 382/131 |
| 2013/0044960 A1* | 2/2013 | Zhang et al. | 382/232 |
| 2013/0207652 A1* | 8/2013 | Weller et al. | 324/309 |

OTHER PUBLICATIONS

Candés E.J. et al., "Robust Uncertainty Principles: Exact Signal Reconstruction From Highly Incomplete Frequency Information" IEEE Transactions on Information Theory 52(2):489-509 (Feb. 2006).

Donoho D.L., "Compressed Sensing" IEEE Transactions on Information Theory 52(4):1289-1306 (Apr. 2006).

King K.F., "Combining Compressed Sensing and Parallel Imaging" Proc. Intl. Soc. Mag. Reson. Med. 16:1488 (2008).

Liang D. et al., "Accelerating SENSE Using Compressed Sensing" Magnetic Resonance in Medicine 62(6):1574-1584 (Dec. 2009).

Liang D. et al., "Accelerating SENSE Using Distributed Compressed Sensing" Proceedings of the 17th Annual Meeting of ISMRM, Honolulu, Hawaii p. 4116 (Apr. 2009).

Liang D. et al., "Accelerating Sensitivity Encoding Using Compressed Sensing" Conf Proc IEEE Eng Med Biol Soc, 2008:1667-70 (Aug. 2008).

Liu B. et al., "SPARSESENSE: Application of Compressed Sensing in Parallel MRI" Proceedings of the 5th International Conference on Information Technology and Application in Biomedicine, in conjunction with The 2nd International Symposium & Summer School on Biomedical and Health Engineering, Shenzhen China, May 30-31, 2008, pp. 127-130.

Lustig M., "Sparse MRI: The Application of Compressed Sensing for Rapid MR Imaging" Magnetic Resonance in Medicine 58(6):1182-95 (Dec. 2007).

Pruessmann K.P. et al., "SENSE: Sensitivity Encoding for Fast MRI" Magnetic Resonance in Medicine 42 (5):952-62 (Nov. 1999).

Sodickson D.K. et al., "Simultaneous Acquisition of Spatial Harmonics (SMASH): Fast Imaging with Radiofrequency Coil Arrays" Magnetic Resonance in Medicine 38(4):591-603 (Oct. 1997).

Wu B. et al., "Applying Compressed Sensing in Parallel MRI" Proc. Intl. Soc. Mag. Reson. Med. 16:1480 (2008).

Ye J.C. et al., "Projection Reconstruction MR Imaging Using FOCUSS" Magnetic Resonance in Medicine 57(4):764-75 (Apr. 2007).

Zhao C. et al., "Compressed Sensing Parallel Imaging" Proc. Intl. Soc. Mag. Reson. Med. 16:1478 (2008).

\* cited by examiner

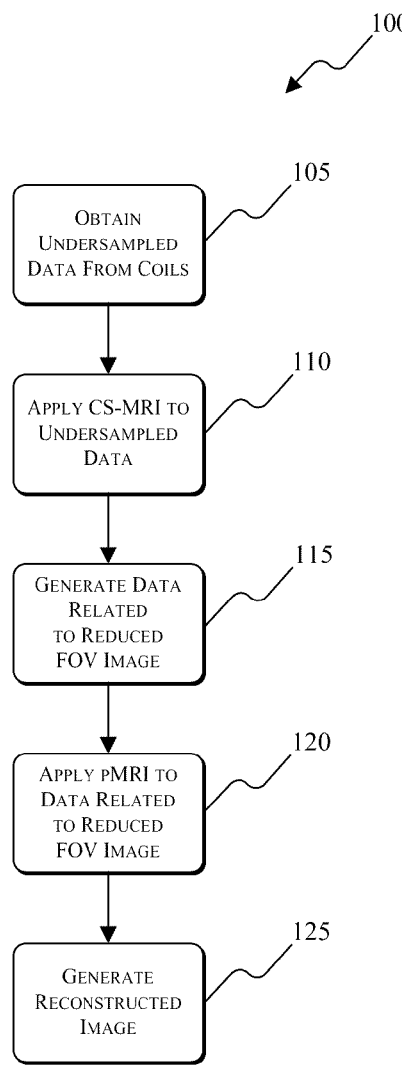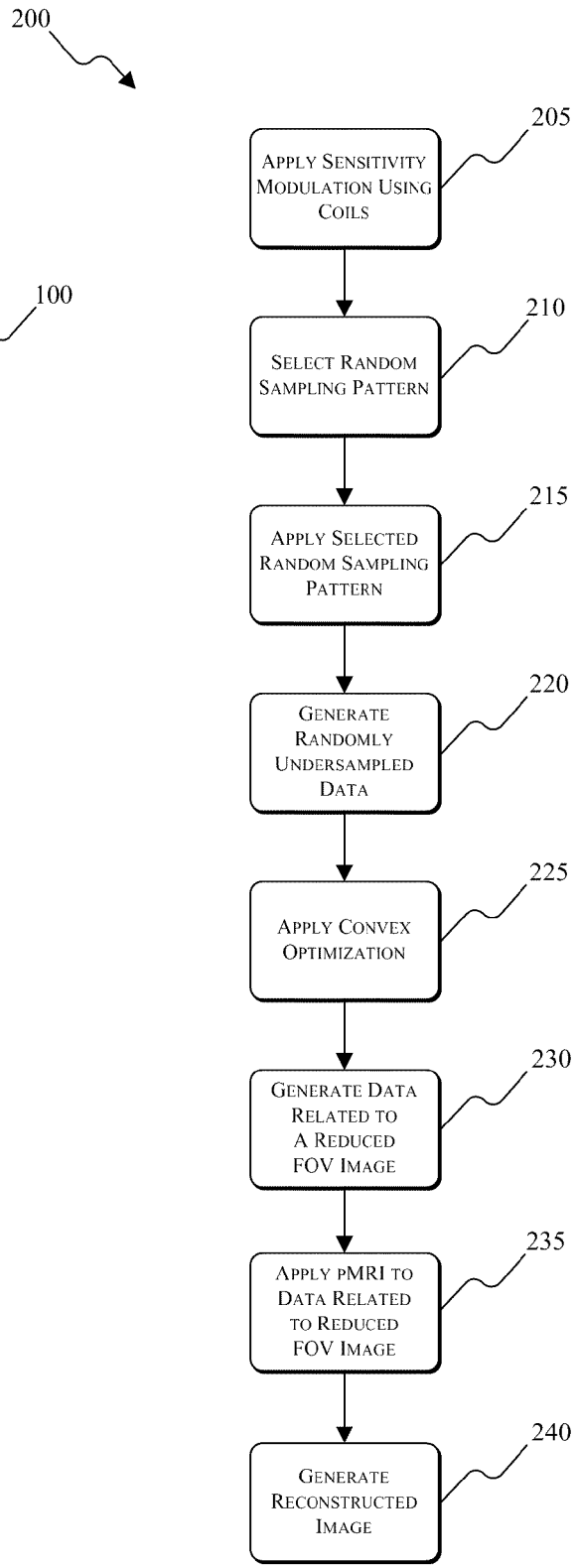

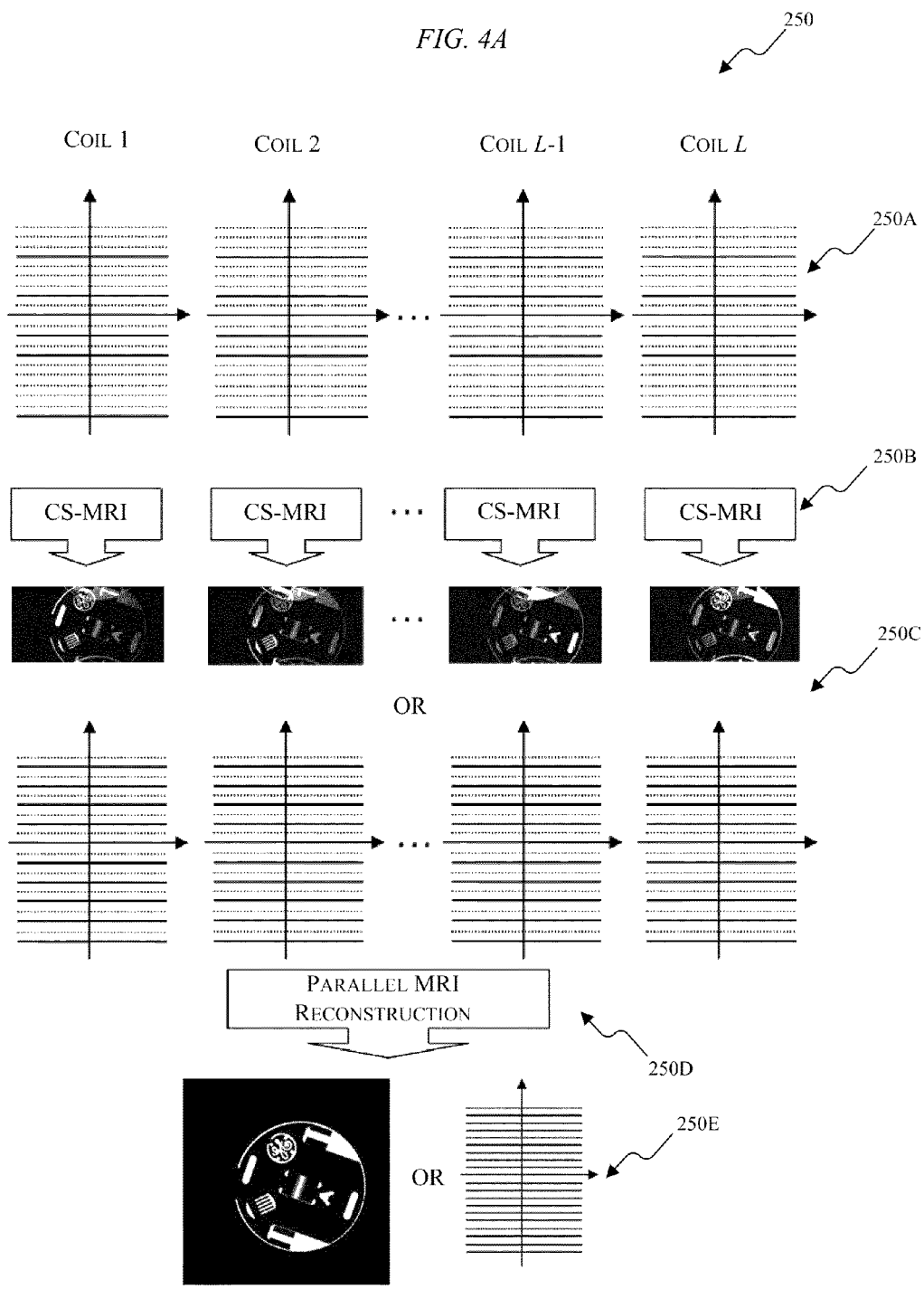

SYSTEMS AND METHODS FOR ACCELERATING THE ACQUISITION AND RECONSTRUCTION OF MAGNETIC RESONANCE IMAGES WITH RANDOMLY UNDERSAMPLED AND UNIFORMLY UNDERSAMPLED DATA

RELATED APPLICATIONS

This application claims the benefit of previously-filed, U.S. Provisional Patent Application No. 61/224,350, filed Jul. 9, 2009, the entire content of which is hereby incorporated by reference.

STATEMENT REGARDING FEDERALLY SPONSORED RESEARCH

This invention was made with U.S. Government support awarded by the National Science Foundation, Grant No. CBET-0731226.

BACKGROUND

This invention relates to magnetic resonance imaging ("MRI"). In MRI, a sample (e.g. a human subject) is placed in a powerful magnetic field where hydrogen protons in the sample align with the magnetic field in one direction or the other. The MRI machine applies a radio pulse that is specific only to hydrogen. The pulse causes the protons in the region of interest to absorb energy and spin in a different direction at a particular frequency. At approximately the same time, gradient fields are turned on and off rapidly in a specific manner, which alters the main magnetic field on a local level. When the radio pulse is turned off, the hydrogen protons return to their natural alignment within the magnetic field, and release excess stored energy in form of radio waves. The radio waves are detected by one or more receiver coils. The data collected by the receiver coils is in the form of spatial frequencies, in what is referred to as the "k-space" of the image. Frequency data in the k-space is mathematically reconstructed into a recognizable image in what is referred to as the "image domain" using procedures such as Fourier transforms.

SUMMARY

One weakness of MRI is the relatively slow rate at which data is collected. During a scan, patients are typically unable to remain sufficiently still for the amount of time required to obtain an image. As a result, motion blurring artifacts appear in the reconstructed magnetic resonance ("MR") images and degrade their quality.

In many instances, the speed of MRI is limited by the number of samples needed in the phase-encoding direction to reconstruct an image. In conventional MRI (i.e. using Fourier encoding), the required number of samples is determined by the field-of-view ("FOV") of each channel and the resolution of the image based on the Shannon sampling theory. Parallel MRI ("pMRI") and compressed sensing ("CS") are techniques for accelerating the acquisition and reconstruction of conventional MR images by reducing the required number of samples (i.e., reducing the amount of acquired data).

pMRI uses multiple detector coils or multi-channel coils to improve imaging speed by reducing the number of samples simultaneously acquired from each channel. SENSitivity Encoding ("SENSE") is one of the standard pMRI reconstruction methods. Other pMRI reconstruction methods include PILS, SMASH, AUTO-SMASH, VD-AUTO-SMASH, GRAPPA, SPACE-RIP, etc. The use of multi-channel coils in pMRI allows MR images to be reconstructed from multi-channel k-space data sampled well below the Nyquist sampling rate (e.g., uniformly downsampled well below the Nyquist sampling rate). In order to implement pMRI reconstruction techniques, data related to coil sensitivities or additional auto-calibrating signals are required. Basic SENSE uses a set of aliased images having reduced FOV and coil sensitivity information to reconstruct the final image.

CS allows for the measurement of sparse or compressible signals at a rate close to their intrinsic information rate, rather than their Nyquist rate. These signals can then be reconstructed by a non-linear procedure that requires very few incoherent measurements. This ability allows for a significant reduction in the amount of data that needs to be sampled in MRI.

Embodiments of the invention combine the SENSE method of pMRI reconstruction with a method of applying CS in MRI known as CS-MRI. CS-MRI is an application of CS to MRI that is based on CS mathematical theory. CS-MRI utilizes certain characteristics of MR images. First, MR images have a sparse representation in a known transform domain (e.g., image domain or wavelet domain). Second, Fourier encoding is incoherent with these sparse transformations. As such, MR images are able to be reconstructed from data sampled at a rate well below the Nyquist rate using a nonlinear convex program. In some embodiments, the sampling rate is approximately the intrinsic information rate associated with the MR images. Because pMRI reduces the number of required samples based on channel sensitivities and CS-MRI reduces the number of required samples based on image sparseness (i.e., different ancillary information), pMRI and CS-MRI can be combined to achieve a greater overall reduction in the number of samples required to reconstruct an MR image.

Based on the generalized sampling theory and under ideal conditions, a reduction factor corresponding to the reduction in the number of samples required for MR image reconstruction is equal to the number of channels of the multi-channel coil. However, in practical applications, such a reduction factor is unrealistic because of limitations such as noise and imperfect coil geometry.

One application of CS to pMRI, known as SparseSENSE, randomly undersamples a full k-space, and uses a nonlinear CS algorithm to directly solve an overdetermined equation to achieve a reduction factor that is less than the number of channels. Because SparseSENSE relates to solving overdetermined equations, SparseSENSE is similar to a regularized SENSE having random trajectories. The $l_1$ regularization used in SparseSENSE is also unable to consistently provide a solution that satisfies the overdetermined data, so SparseSENSE always searches for a balance between data consistency and sparsity.

The overdetermined equation is a constrained convex optimization equation that is similar to the one solved in SparseMRI (a CS-MRI technique described below). An example of the overdetermined equation is provided below as EQN. 1.

$$\min_f (\|\Psi f\|_1 + \alpha \|f\|_{TV}) \text{ s.t. } \|Ef - d\|_2 \le \varepsilon \qquad \text{EQN. 1}$$

However, one difference between SparseMRI and SparseSENSE is that a Fourier encoding matrix, F, in SparseMRI is replaced by a sensitivity encoding matrix, E, which consists of both Fourier encoding and sensitivity weighting. Among other problems associated with the use of SparseSENSE, the sensitivity encoding matrix, E, is known to be less incoherent with the sparsifying basis, $\Psi$ (e.g., an identity basis, a wavelet basis, etc.), than is the traditional Fourier encoding matrix, F.

As described above, CS requires incoherence between the encoding matrix and any sparsifying transform. When employing SparseSENSE, the incoherence between the sensitivity encoding matrix and the sparsifying transform is theoretically unproven, and therefore, SparseSENSE is unable to ensure proper MR image reconstruction. An assertion to the contrary is without mathematical proof at least partly because the sensitivity encoding matrix is not an orthonormal basis primarily considered in CS theory, and the incoherence of the sensitivity encoding matrix and the sparsifying transform in SparseSENSE depends on channel sensitivities and physical characteristics of each coil in a machine. These characteristics vary from coil-to-coil, machine-to-machine, and scan-to-scan, and make proof of the incoherence between the sensitivity encoding matrix and the sparsifying transform impractical to prove.

Because of these limitations, a sequential combination of SparseMRI, a CS-MRI technique that has successfully applied CS to MRI for reduced Cartesian sampling, and SENSE is used to reduce the amount of data required to reconstruct MR images. The combination of SparseMRI and SENSE uses SparseMRI to generate a set of aliased, reduced FOV image data for each channel of the multi-channel coil, and then uses SENSE to reconstruct a final image from the aliased, reduced FOV image data. This combination of SparseMRI and SENSE is referred to herein as CS-SENSE.

As such, the invention relates to a method and system for combining pMRI and CS with guaranteed incoherence. The method sequentially carries out CS using SparseMRI to generate a set of reduced FOV image data from further undersampled data for each coil channel, and then uses the pMRI reconstruction technique SENSE to generate a final unfolded image. Because the encoding matrix used in the CS reconstruction is a Fourier matrix, as in conventional MRI, incoherence between the encoding matrix and the sparsifying matrix is assured.

In one embodiment, the invention provides a method for reconstructing MR images which uses SparseMRI to generate a set of aliased images from randomly undersampled data. SENSE is then applied to reconstruct the final image. A total reduction factor is a product of a first reduction factor achieved using SparseMRI and a second reduction factor achieved using SENSE.

In another embodiment, the invention provides a method of reconstructing magnetic resonance ("MR") images. The method includes obtaining a first set of data from a first receiver coil. The first set of data is a subset of a second set of data, and the second set of data is associated with a first reduced field-of-view ("FOV") image. The method also includes obtaining a third set of data from a second receiver coil. The third set of data is a subset of a fourth set of data, and the fourth set of data is associated with a second reduced FOV image. The method also includes generating the second set of data based on the first set of data, generating the fourth set of data based on the third set of data, and generating a fifth set of data based on the second set of data and the fourth set of data. The fifth set of data is associated with a reconstructed full FOV image.

In another embodiment, the invention provides a system for reconstructing images. The system includes a processing unit configured to obtain a first set of data from a first receiver coil. The first set of data is a subset of a second set of data, and the second set of data is associated with a first reduced field-of-view ("FOV") image. The processing unit is further configured to obtain a third set of data from a second receiver coil. The third set of data is a subset of a fourth set of data, and the fourth set of data is associated with a second reduced FOV image. The processing unit is further configured to generate the second set of data based on the first set of data, generate the fourth set of data based on the third set of data, and generate a fifth set of data based on the second set of data and the fourth set of data. The fifth set of data is associated with a reconstructed full FOV image.

In another embodiment, the invention provides a method of image reconstruction. The method including applying compressed sensing acquisition to signals from each of a plurality of receiver coils to obtain a first set of data. The first set of data is associated with an undersampled, reduced field-of-view ("FOV") image from each of the plurality of receiver coils. The method also includes applying a convex optimization to the first set of data to generate a second set of data. The second set of data is associated with a reduced FOV image from each of the plurality of receiver coils. The method also includes applying a parallel magnetic resonance imaging ("pMRI") reconstruction to the second set of data to generate a third set of data. The third set of data is associated with a reconstructed full FOV image.

In another embodiment, the invention provides a system for reconstructing images. The system includes a processing unit that is configured to apply compressed sensing acquisition to signals from each of a plurality of receiver coils to obtain a first set of data. The first set of data is associated with an undersampled, reduced field-of-view ("FOV") image from each of the plurality of receiver coils. The processing unit is further configured to apply a convex optimization to the first set of data to generate a second set of data. The second set of data is associated with a reduced FOV image from each of the plurality of receiver coils. The processing unit is further configured to apply parallel magnetic resonance imaging ("pMRI") reconstruction to the second set of data to generate a third set of data. The third set of data is associated with to a reconstructed full FOV image.

Other aspects of the invention will become apparent by consideration of the detailed description and accompanying drawings.

BRIEF DESCRIPTION OF THE DRAWINGS

FIG. 2 is a process for acquiring and reconstructing magnetic resonance images according to an embodiment of the invention.

FIG. 3 is another process for acquiring and reconstructing magnetic resonance images.

FIG. 4A illustrates a process for reconstructing a full FOV two-dimensional image.

DETAILED DESCRIPTION

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways.

Embodiments of the invention described herein relate to accelerating the acquisition of magnetic resonance imaging ("MRI") data. The MRI data acquired using, for example, parallel MRI ("pMRI") acquisition techniques represents a reduced field-of-view ("FOV") image or a set of uniformly undersampled k-space data for each of a plurality of coils or channels of a multi-channel coil. The pMRI data is further undersampled to generate a set of undersampled, reduced FOV image data by applying a compressed sensing ("CS") technique such as SparseMRI. The undersampled, reduced FOV image data is then reconstructed into a final magnetic resonance ("MR") image using a pMRI reconstruction technique such as SENSitivity encoding ("SENSE"). This combination of SparseMRI and SENSE is referred to herein as CS-SENSE. As described below, testing of this method has demonstrated that CS-SENSE achieves a greater reduction factor than other methods of implementing pMRI and CS individually or in combination. Although various embodiments of the invention are described with respect to the use of the SENSE pMRI reconstruction technique, other pMRI reconstruction techniques, such as PILS, SMASH, AUTO-SMASH, VD-AUTO-SMASH, GRAPPA, SPACE-RIP, etc, can also be used.

Figure 1:
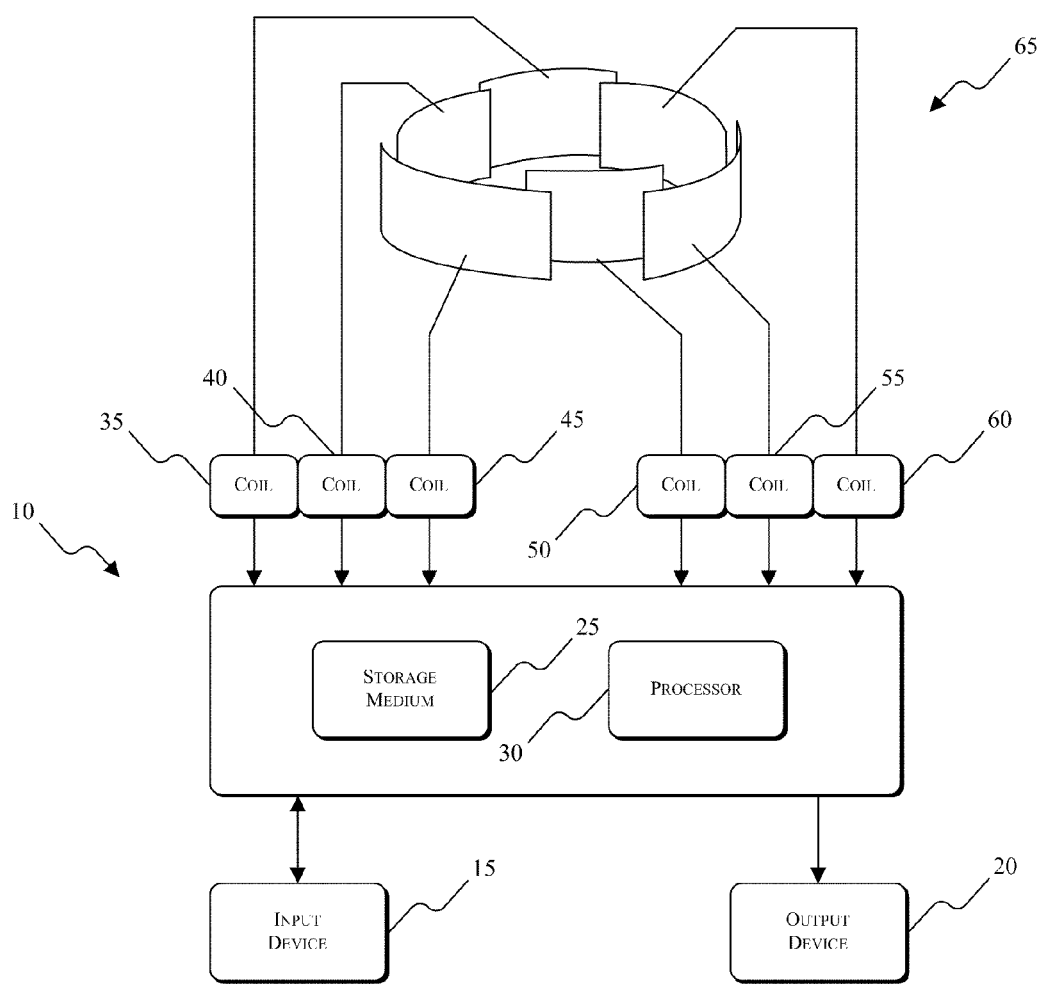
FIG. 1 illustrates a parallel magnetic resonance imaging system and computer system according to an embodiment of the invention.

The methods described herein for accelerating the acquisition and reconstruction of MR images are implemented in a computer system, such as computer system 10 illustrated in FIG. 1. The system 10 includes an input device 15, an output device 20, a storage medium 25, and a processing unit or processor 30. The computer system 10 is connected to a set of receiver coils 35-60 of a pMRI system 65. Although the illustrated embodiment of the pMRI system 65 includes six coils, other numbers of coils can also be used. In some embodiments, 4, 8, 12, 16, 32, etc. coils are included in the pMRI system. The input device 15 includes, for example, one or more keyboards, computer mice, touch screens, or the like. The output device 20 includes a display device, such as a cathode-ray tube ("CRT") monitor, a liquid-crystal display ("LCD") monitor, or the like, as well as one or more printing devices, such as an ink jet printer, a laser printer, or the like. The storage medium 25 includes a memory, such as, for example, a read-only memory ("ROM"), a random access memory ("RAM"), an electrically erasable programmable read-only memory ("EEPROM"), a flash memory, a hard disk, or another suitable magnetic, optical, physical, or electronic memory device. The processor 30 is connected to the storage medium 25 (e.g., a RAM or ROM) and executes software that can be stored in the RAM (particularly during execution), the ROM (on a generally permanent basis), or another non-transitory computer readable medium such as another memory or a disc. Additionally or alternatively, the processor 30 includes the RAM or ROM. In other embodiments, a microprocessor, a microcontroller, or another programmable device with suitable memory and I/O devices is used. The software is executed by the processor 30 to perform calculations and direct functions such as performing input, output, and display of data collected from the pMRI system 65 and related to the methods described herein. In some embodiments, the computer system 10 reconstructs the pMRI data into images using the methods described herein and displays the images on the output device 20 in approximately real time. In another embodiment, the images are reconstructed and displayed at a later time (i.e. off-line).

SENSE is one of the standard reconstruction methods for pMRI. For arbitrary trajectories, the general SENSE equation is provided below as EQN. 2.

$$Ef = d \qquad \text{EQN. 2}$$

where d is the vector formed from k-space data acquired in each of the plurality of channels, f is an unknown vector defining the desired full-FOV image to be computed (i.e., both with a lexicographical row ordering of the two-dimensional array components), and E is the sensitivity encoding matrix whose entries are given below as EQN. 3.

$$E_{\{l,m\},n} = e^{-i2\pi(k_x x + k_y y)} s_l(x,y) \qquad \text{EQN. 3}$$

where $k_x$ and $k_y$ denote the k-space sampling position for the m-th element in d, (x, y) denotes the pixel position for the n-th element in f, and $s_l$ is the sensitivity profile of the l-th receiver channel.

CS is a mathematical framework for signal sampling and recovery. CS allows faithful and accurate recovery of a sparse signal, x, of size n from its linear measurements $y = \Phi x$ whose size m is much less than n, by solving a convex program, as shown in EQN. 4.

$$\min_{x} \|\Psi x\|_1 \text{ s.t. } \Phi x = y \qquad \text{EQN. 4}$$

where $\Phi$ is the CS encoding matrix, $\Psi$ is a sparsifying transform, and $\|x\|_1$ is the $l_1$ norm defined as the sum of the complex modulus $$\|x\|_1 = \sum_i |x_i|.$$

Faithful recovery of an image from a reduced number of samples or measurements theoretically requires certain conditions to be satisfied, such as: (1) the signal is sparse after a known sparsifying transform, $\Psi$; (2) the encoding matrix, $\Phi$, is incoherent with the sparsifying transform, $\Psi$; and (3) the number of measurements exceed the minimum requirement, which, in some embodiments, is approximately 2 to 5 times the sparsity of x.

The above conditions may not have to be precisely satisfied in practical implementations of sampling and reconstruction to still recover the signal with good fidelity, as long as the measurements are sufficiently incoherent. As an illustrative example, measurements, y, are taken which are not sparse (i.e., in the strict meaning of the term) but are compressible (i.e., sparse after thresholding the transform coefficients). The measurements include noise, e, having an energy level that is bounded by a constant, $\epsilon$, as shown below in EQN. 5.

$$y = \Phi x + e \|e\|_2 \le \epsilon. \qquad \text{EQN. 5}$$

In such a situation, the signal is recovered as shown in EQN. 6.

$$x^* = \arg\min_x \|\Psi x\|_1 \text{ s.t. } \|\Phi x - y\|_2 \le \varepsilon, \qquad \text{EQN. 6}$$

and reconstruction error is bounded as provided in EQN. 7.

$$\|x^* - x\|_2 \le c_1 \frac{\|x - x^S\|_1}{\sqrt{S}} + c_2 \varepsilon, \qquad \text{EQN. 7}$$

where $c_1$ and $c_2$ are the constants and have values that are smaller when there is a high level of incoherence and/or a large number of measurements. The reconstruction error is proportional to the noise level, $\epsilon$, and an approximation error between the signal, x, and its closest S-sparse signal, $x^S$. Accordingly, in a practical implementation, the quality of a CS reconstruction is dependent upon, for example, the level of incoherence, the number of measurements, the amount of measurement noise, and the compressibility of the image.

SparseMRI applies CS to conventional Cartesian MRI. Conventional Fourier imaging meets the relaxed CS conditions described above in that the MR images are compressible using a sparsifying transform (e.g., an identity transform, a wavelet transform, etc.), and Fourier encoding is sufficiently incoherent with the sparsifying transform. SparseMRI fully samples the k-space along the readout direction, and randomly undersamples the k-space along the phase-encoding direction using a variable-density sampling scheme with denser sampling near the center of the k-space. The randomly generated sampling pattern with the lowest peak transform point spread function ("TPSF") is selected for data acquisition. The final image is reconstructed from the undersampled k-space data by solving the constrained convex optimization problem given by EQN. 8.

$$\min_f (\|\Psi f\|_1 + \alpha \|f\|_{TV}) \text{ s.t. } \|F_u f - d_u\|_2 \le \varepsilon \qquad \text{EQN. 8}$$

where F and d are the Fourier encoding matrix and the corresponding vector formed from the fully sampled k-space data, respectively, the subscript, u, denotes a random subset of the rows, and $\|f\|_{TV}$ is the total variation ("TV") defined as $\|f\|_{TV} = \Sigma \sqrt{|\nabla_x f|^2 + |\nabla_y f|^2}$, where $\nabla_x$ and $\nabla_y$ are the finite difference along x and y respectively, and $|\cdot|$ is the complex modulus.

This formulation requires the image to be sparse in both the transform domain defined by $\Psi$ and the finite difference domain. The level of sparseness is controlled by the constant, $\alpha$. The constrained minimization in EQN. 8 is usually achieved by solving an equivalent unconstrained regularization problem, such as that provided below in EQN. 9.

$$\arg\min_f \{\|F_u f - d_u\|_2^2 + \lambda(\|\Psi f\|_1 + \alpha \|f\|_{TV})\} \qquad \text{EQN. 9}$$

where $\lambda$ is a regularization parameter that is selected such that the solution of EQN. 9 is the same as the solution of EQN. 8.

When the sampling is performed on a uniform Cartesian grid, the sensitivity encoding from EQN. 2 can be decomposed into two sequential linear operations. The first operation is a sensitivity modulation, C, where the original full-FOV image, f, is weighted by different sensitivities for each of the multiple channels. The image, f, weighted by the sensitivity of each channel is then folded to generate a set of aliased images with a reduced FOV, $f^A$, as shown in EQN. 10.

$$Cf = f^A \qquad \text{EQN. 10}$$

where vector, f, represents the pixels of the desired image that are superimposed in the aliased image, and vector, $f^A$, represents the pixels in the same position of the aliased images from all channels.

The second operation is a Fourier transform of each aliased image, as shown below in EQN. 11.

$$F f_l^A = d_l \qquad \text{EQN. 11}$$

where $f_l^A$ is the reduced FOV aliased image of the l-th channel, and $d_l$ is the reduced k-space data from the l-th channel. Because EQN. 11 is equivalent to the conventional Fourier encoding formulation, SparseMRI can be directly applied to the aliased image from each channel without compromising the incoherence of the sparsifying transform and the encoding transform. The image vector, $f^A$, is a stack of vectors, $f_l^A$, from each channel. A general Cartesian SENSE reconstruction utilizes the above sequential operations. First, the acquired data is Fourier transformed to obtain a set of aliased images, and then the aliased images are unfolded by solving EQN. 10.

CS-SENSE utilizes the decoupled formulation described above, but replaces the Fourier transform procedure with SparseMRI. Such a replacement is based on the fact that the aliased, reduced FOV images, $f_l^A$, are sparse if the original, full FOV image is sparse following a sparsifying transform. During data acquisition, the random sampling scheme employed in SparseMRI is used to further undersample the data along the phase encoding direction that has already been undersampled to produce the reduced FOV aliased images. Any of a variety of sampling patterns can be used. For example, one of twenty randomly generated sampling patterns having the lowest peak TPSF is selected to acquire the data. For the selected random sampling pattern, a variable-density sampling scheme having denser sampling near the center of the k-space is applied which accounts for the energy of MR images being concentrated in the central region of the k-space.

The selected sampling pattern is able to be reused for the acquisition of other images if the sparsifying transform and the image size stay the same. Following the random undersampling, EQN. 11 becomes underdetermined, and is expressed as shown in EQN. 12.

$$F_u f_l^A = d_{u,l} \quad \text{EQN. 12}$$

where $d_{u,l}$ is the undersampled k-space data from the l-th channel and is a subset of $d_l$. In reconstruction, the aliased image $f_l^A$ of each channel is solved using EQN. 13.

$$\min_{f_l^A}(\|\Psi f_l^A\|_1 + \alpha\|f_l^A\|_{TV}) \text{ s.t. } \|F_u f_l^A - d_{u,l}\|_2 \leq \varepsilon \quad \text{EQN. 13}$$

However, due to computational complexity, the EQN. 13 can be solved by the equivalence shown in EQN. 14.

$$\operatorname*{argmin}_{f_l^A}\{\|F_u f_l^A - d_{u,l}\|_2^2 + \lambda(\|\Psi f_l^A\|_1 + \alpha\|f_l^A\|_{TV})\} \quad \text{EQN. 14}$$

where the parameter $\lambda$ is determined by solving EQN. 14 using different values of $\lambda$, and choosing a value for $\lambda$ such that $\|F_u f_l^A - d_{u,l}\|_2 \approx \varepsilon$.

Using the aliased image from each channel, the full-FOV image, f, is reconstructed pixel-by-pixel using the image domain Cartesian SENSE method. For example, the full FOV image, f, is reconstructed pixel by pixel using a sum-of-squared ("SoS") solution or a least squares solution, as shown below in EQN. 15.

$$f = (C^H C)^{-1} C^H f^A \quad \text{EQN. 15}$$

In some embodiments, no regularization is used when reconstructing the full-FOV image, f. In other embodiments, regularization is used. A total reduction factor, R, that is achieved using CS-SENSE is equal to the product of a first reduction factor, $R_1$, from the use of SparseMRI, and a second reduction factor, $R_2$, from the use of Cartesian SENSE. The total reduction factor, R, is calculated as shown below in EQN. 16.

$$R = R_1 \times R_2 \quad \text{EQN. 16}$$

The technique set forth above for accelerating the acquisition and reconstruction of MR images is described with respect to the methods or processes of FIGS. 2 and 3. With reference to FIG. 2, a process 100 is provided for accelerating the acquisition and reconstruction of MR images. At step 105, a set of undersampled data is obtained from each of a plurality of coils using a pMRI acquisition technique (e.g., uniform skipping or undersampling). CS-MRI is then applied to the undersampled data (step 110) to generate a set of data related to or associated with a reduced FOV image for each of the plurality of coils (step 115). A pMRI reconstruction technique is applied to the data related to the reduced FOV image (step 120) to generate a final reconstructed image (step 125).

FIG. 3 illustrates a process 200 that is similar to the process 100 described above with respect to FIG. 2. At step 205, sensitivity modulations are applied to a full FOV image using the plurality of coils (e.g., phased array coils) such that each coil is operable to produce a reduced FOV image. One of an infinite number of random undersampling patterns is selected (step 210) and applied to the reduced FOV image associated with each coil (step 215). Following step 215, a set of randomly undersampled data is generated or obtained (step 220). The randomly undersampled data corresponds to a twice-reduced or twice undersampled set of data. The first reduction in the size of the set of data (e.g., when compared to the data associated with a full FOV image) is a result of parallel imaging acquisition (e.g., a uniform undersampling or skipping). The second reduction is a result of compressed sensing acquisition (e.g., the selected random sampling or undersampling pattern). A convex optimization is applied to the set of randomly undersampled data (step 225) to generate a set of data related to a reduced FOV image (step 230). A pMRI reconstruction technique (e.g., SENSE) is applied to the data related to the reduced FOV image (step 235), and a reconstructed image is generated (step 240).

Figure 4B:
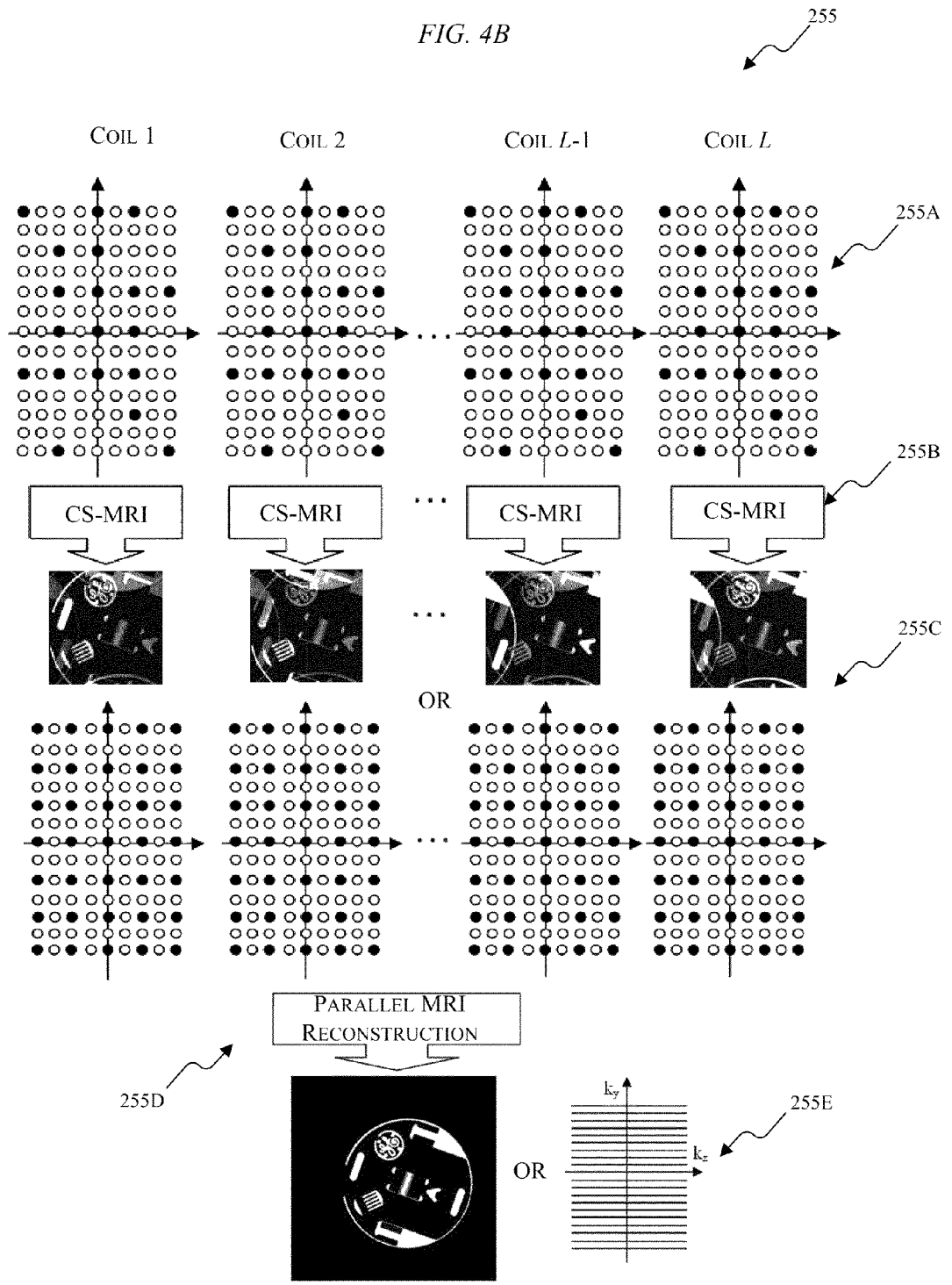
FIG. 4B illustrates a process for reconstructing a full FOV three-dimensional image.

FIGS. 4A and 4B illustrate processes 250 and 255, respectively, associated with reconstructing a full FOV image using the above-describe methods. FIG. 4A is related to a 2D-MRI system, and FIG. 4B is related to a 3D-MRI system. With reference to FIG. 4A and a 2D-MRI system, a set of data is obtained or acquired at step 250A. The illustrated k-space data from each of coils 1-L are both uniformly and randomly undersampled along one dimension (e.g., the phase encoding direction). For example, the pMRI acquisition techniques uniformly reduce the amount of data that is ultimately acquired from each coil, and a random sampling pattern is selected and applied to obtain the uniformly and randomly undersampled k-space data illustrated at step 250A. CS-MRI is applied at step 250B to generate a set of k-space data related to or associated with the uniformly undersampled data or aliased, reduced FOV images (step 250C). A pMRI reconstruction technique is then applied to the uniformly under-sampled k-space data (step 250D) to generate a set of data related to or associated with a full FOV reconstructed image (step 250E). A similar method is applied during process 255 of FIG. 4B which is related to a 3D-MRI system. Similar steps are identified with corresponding letters (e.g., A, B, C, etc.). Unlike process 250, in process 255 the undersampling is along two dimensions.

The improvements of CS-SENSE over other image reconstruction techniques, such as SparseSENSE have been evaluated and experimentally verified using a variety of datasets. For example, as described below, the performance of CS-SENSE has been evaluated using simulated data having varying levels of noise, scanned phantom data, and T1-weighted human brain data (e.g., axial and sagittal). All reconstruction techniques described herein were implemented in MATLAB on an HP XW8400 workstation with a 2.33 GHz CPU and 2 GB RAM. With reference to FIGS. 5-16, the CS-SENSE technique is labeled as "A", the SparseSENSE technique is labeled as "B", the SparseMRI technique is labeled as "C", and the VD-SENSE is labeled as "D".

A non-linear conjugate gradient is used to solve EQN. 14 for the aliased image $f_l^A$ of each channel, and a sum-of-squares ("SoS") reconstruction from the fully sampled data was used as a reference image. A normalized mean square error ("NMSE") between the reconstructed image and the reference image is calculated to quantitatively evaluate the performance of CS-SENSE (e.g., image noise, artifacts, loss of resolution, etc.). To facilitate comparison between various reconstruction techniques and an evaluation of image noise, artifacts, and resolution, each reconstructed image for a given dataset is shown individually and at the same scale.

A 256×256 numerical phantom is constructed and used as the original image. The numerical phantom is piecewise smooth and strictly sparse (i.e., most coefficients are exactly zero). The evaluation of the numerical phantom is used to demonstrate that CS-SENSE can be used for exact reconstruction of a strictly sparse image when sufficient noise-free measurements are available. The evaluation of the numerical phantom also demonstrates how reconstruction quality is affected by increased levels of undersampling and noise.

Simulated k-space data is generated by Fourier transforming sensitivity-weighted images, and undersampling the k-space data according to a selected random sampling pattern. The sensitivities of an eight-channel coil were simulated using the Biot-Savart law. Varying levels of Gaussian noise were added to the simulated k-space data to investigate the effects of additional noise. The average signal-to-noise ratios ("SNR") corresponding to the varying levels of Gaussian noise were infinite (i.e., no noise), 30 dBs, 15 dBs, and 7.5 dBs.

Additionally, reduction factors, R, of the form $R=R_1 \times R_2$ were evaluated, where the first reduction factor, $R_1$, is the reduction factor associated with SparseMRI, and the second reduction factor, $R_2$, is the reduction factor associated with SENSE. The evaluated reduction factors were $R=2 \times 2$, $R=3 \times 2$, and $R=4 \times 2$. These combinations of $R_1$ and $R_2$ were selected to provide the best possible reconstruction among a variety of potential combinations for a given reduction factor. Each evaluation includes a reconstruction using SparseSENSE for comparison, and the NMSEs were calculated as a function of the reduction factor, R, and SNR.

Figure 5:
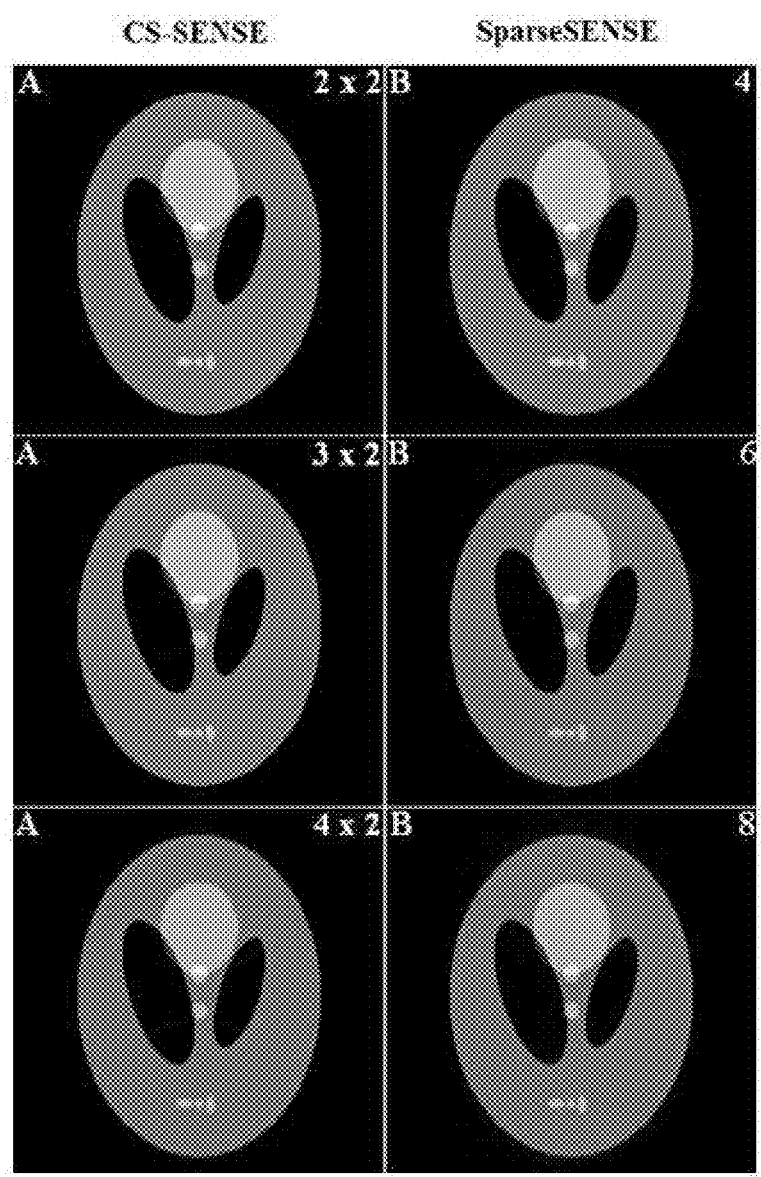
FIG. 5 illustrates images reconstructed from a set of simulated, eight-channel, noise-free data having a variety of reduction factors.

FIG. 5 illustrates a set of images 300 of a numerical phantom that was reconstructed using both CS-SENSE and SparseSENSE in an ideal, noise-free scenario (i.e., SNR=∞). The left column illustrates CS-SENSE reconstructed images (denoted as "A"), and the right column illustrates SparseSENSE reconstructed images (denoted as "B"). Corresponding reduction factors are shown in the top right corner of each image. With a reduction factor of 4, each method is able to exactly reconstruct the original image, and there are few or no discernible visual differences between the two reconstructed images. As the reduction factor is increased, the quality of the reconstructions using both CS-SENSE and SparseSENSE deteriorate and the artifacts appear in the images. With a reduction factor of 8, both reconstructed images have visible undersampling artifacts. However, the image reconstructed using CS-SENSE is discernibly smoother, and because the exact sensitivity profiles are being used, the SENSE step of CS-SENSE is only amplifying artifacts from the previous step and does not introduce any additional artifacts into the reconstructed image.

Figure 6:
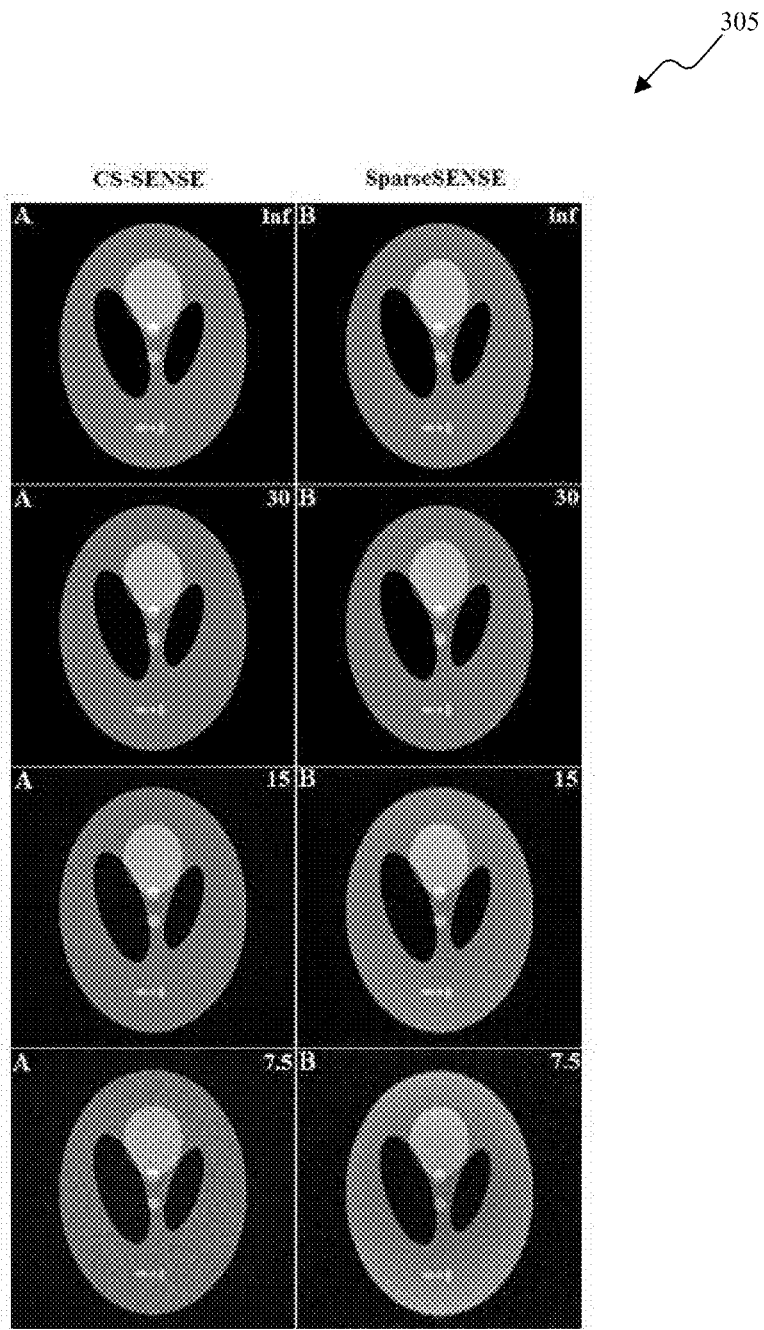
FIG. 6 illustrates images reconstructed from a set of simulated, eight-channel data having a variety of levels of noise.

FIG. 6 illustrates a set of reconstructed images 305 for CS-SENSE and SparseSENSE having a reduction factor, R, of R=4 and varying levels of noise. The left column illustrates CS-SENSE reconstructed images (denoted as "A"), and the right column illustrates SparseSENSE reconstructed images (denoted as "B"). Corresponding SNRs are shown in the top right corner of each image. The greater the amount of measurement noise that is present, the greater the amount of reconstruction noise is present in the reconstructed images. However, as can be appreciated by the side-by-side comparison of CS-SENSE and SparseSENSE, CS-SENSE preserves the structures of the image and includes only random noise. Such an observation is in agreement with the CS reconstruction error bounding described by EQN. 7, which increases with the measurement noise level when other conditions remain static. In contrast, when using SparseSENSE, the measurement causes reconstruction noise, but also introduces artifacts which become more pronounced at low SNRs. Such an effect is described in the context of regularization. While at low SNRs, regularization suppresses large noise at the expense of increasing blurriness and artifacts.

Table #1 provides NMSEs (in percent) for both CS-SENSE and SparseSENSE for reduction factors of R=4, R=6, and R=8, and SNRs of 7.5 dBs, 15 dBs, and 30 dBs. Although NMSE is too general to provide a precise metric for the quality of a reconstructed image, Table #1 provides a quantitative measure of the overall error present in the reconstructed images. As expected, each method performed better at higher SNRs and lower reduction factors. However, as can also be seen, CS-SENSE generated images having less overall error (i.e., a lower NMSE) than the images generated using SparseSENSE for each reduction factor and each SNR.

TABLE #1

| | Reconstruction Error (%) Using Simulation Data | | | | | | | | |
|---|---|---|---|---|---|---|---|---|---|
| | R Factor | | | | | | | | |
| | 0 | 4 (2 × 2) | | | 6 (3 × 2) | | | 8 (4 × 2) | |
| SNR (dB) | 7.5 | 15 | 30 | 7.5 | 15 | 30 | 7.5 | 15 | 30 |
| CS-SENSE | 2.22 | 0.77 | 0.05 | 2.34 | 0.75 | 0.19 | 2.63 | 0.79 | 0.34 |
| SparseSENSE | 3.09 | 0.90 | 0.12 | 3.74 | 1.34 | 0.35 | 3.91 | 1.75 | 0.56 |

The evaluation based on phantom data demonstrates that CS-SENSE is able to generate high quality reconstructions from actual scan data which has been highly reduced and satisfies the sparsity requirement.

The phantom data includes well-defined, piecewise-smooth structures. A $T_1$-weighted scan was performed on the phantom data using a 2D spin echo sequence on a 3T commercial scanner having an 8-channel torso coil (TE/TR=11/300 ms, 18 cm FOV, 8 slices, 256×256 matrix). A full set of k-space data were acquired, and the central 32 fully-sampled phase encodings were used to estimate the channel sensitivity profiles. Specifically, a set of low-resolution images were generated from the central k-space data and weighted by a cosine taper window. These images were then normalized using SoS reconstruction, and weighted by a mask that set low-intensity regions of the image to zero. The mask is used to reduce sensitivity estimation error caused by the low-intensity regions of the image.

The k-space data were reduced by manually removing data to simulate reduction factors, R, of R=2×2, R=3×2, and R=4×2. Only the reduced k-space data were used for final reconstruction. Because the phantom data itself is sparse, an identity matrix was used as the sparse transformation, Ψ, for CS-SENSE reconstruction. The results of reconstruction using CS-SENSE were compared to the reconstruction results obtained using SparseSENSE, VD-SENSE, and SparseMRI. SparseMRI was used on full-FOV image in each channel and a SoS reconstruction. VD-SENSE used $l_2$ regularization, and a regularization function such as that shown in EQN. 17.

$$\|\nabla f\|_2 = \Sigma |\nabla_x f|^2 + |\nabla_y f|^2 \qquad \text{EQN. 17}$$

Figure 7:
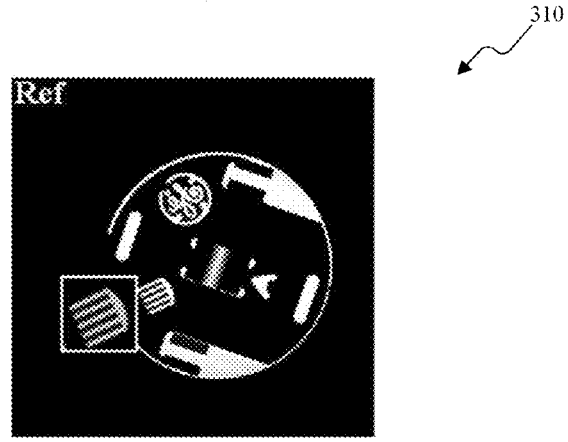
FIG. 7 illustrates a reference image corresponding to a set of phantom data.
Figure 8:
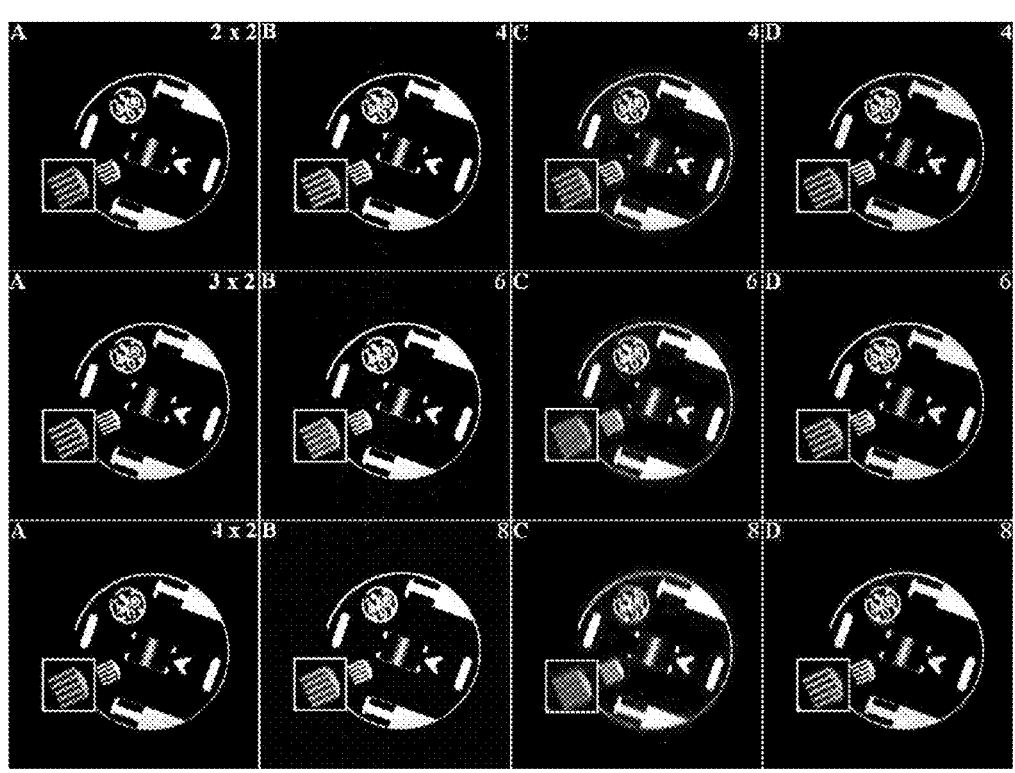
FIG. 8 illustrates images reconstructed using CS-SENSE (A), SparseSENSE (B), SparseMRI followed by SoS (C), and VD-SENSE with $l_2$ regularization (D) from the phantom data of FIG. 7.

FIG. 7 illustrates a reference image 310 of scanned phantom data. FIG. 8 illustrates reconstructed images 315 of scanned phantom data. Each image has a zoomed-in portion in the bottom-left hand corner which illustrates a "comb region." The comb region provides an illustrative example of the effect noise has on a reconstructed image and a metric by which to compare CS-SENSE to SparseSENSE. FIG. 8 also includes reconstructed images produced using a combination of SparseMRI and SoS, and reconstructed images using VD-SENSE. With a reduction factor, R, of R=4, both CS-SENSE and SparseSENSE generate reconstructed images which are approximately identical to the reference image represented by the phantom data. In contrast, the image reconstructed using SparseMRI followed by SoS reconstruction includes visible undersampling artifacts. The undersampling artifacts appear in the reconstructed image because SparseMRI does not utilize channel sensitivity information. It is, therefore, difficult to achieve a high reduction factor using SparseMRI and SoS alone. VD-SENSE, which uses $l_2$ regularization, also has more noise in the reconstructed image than CS-SENSE, but has less noise than the SparseMRI and SoS technique.

The benefits of CS-SENSE become more apparent as the reduction factor, R, increases. For example, when the reduction factor, R, is R=6, CS-SENSE is able to preserve image resolution while the other reconstruction techniques generate blurred images. The effects of the increased reduction factors are apparent when viewing the comb region of each reconstructed image. CS-SENSE is able to generate a reconstructed image having good resolution when the reduction factor is equal to the number of channels used in the MRI (e.g., 8 channels), while the level of detail in images reconstructed using the other techniques falls precipitously. The results of the scanned phantom data demonstrate that CS-SENSE is able to achieve a high reduction factor when reconstructing sparse or highly-sparse images for SNRs that correspond to those found in actual MR image data.

The evaluation of in vivo images was performed to assess CS-SENSE with respect to images which are not as sparse as the above-described phantom data. The in vivo images are compressible using, for example, a wavelet transform, finite-difference transform, or the like. Two sets of in vivo brain data sets (axial and sagittal) were acquired. The axial data set was acquired using a 3T commercial scanner having an 8-channel head coil using a 2D T1-weighted spin echo protocol (TE/TR=11/700 ms, 22 cm FOV, 10 slices, 256×256 matrix). The sagittal data set was acquired using a 1.5T SIEMENS Avanto system having a 4-channel head coil using a 2D T1-weighted spin echo protocol (TE/TR=Min Full/500 ms, 24 cm FOV, 256×256 matrix). The sagittal data set is less compressible (i.e., has a larger compression error with the same compression ratio) than the axial data set because of the level of detail in the sagittal data set. The Daubechies-4 wavelet was used as the sparse transformation, $\Psi$. Like the phantom experiment, SoS reconstruction was used as a reference for comparison. The 32 central, fully-sampled phase encodings were used to estimate the channel sensitivity profiles, and a variety of reduction factors were used for each reconstruction.

Figure 9:
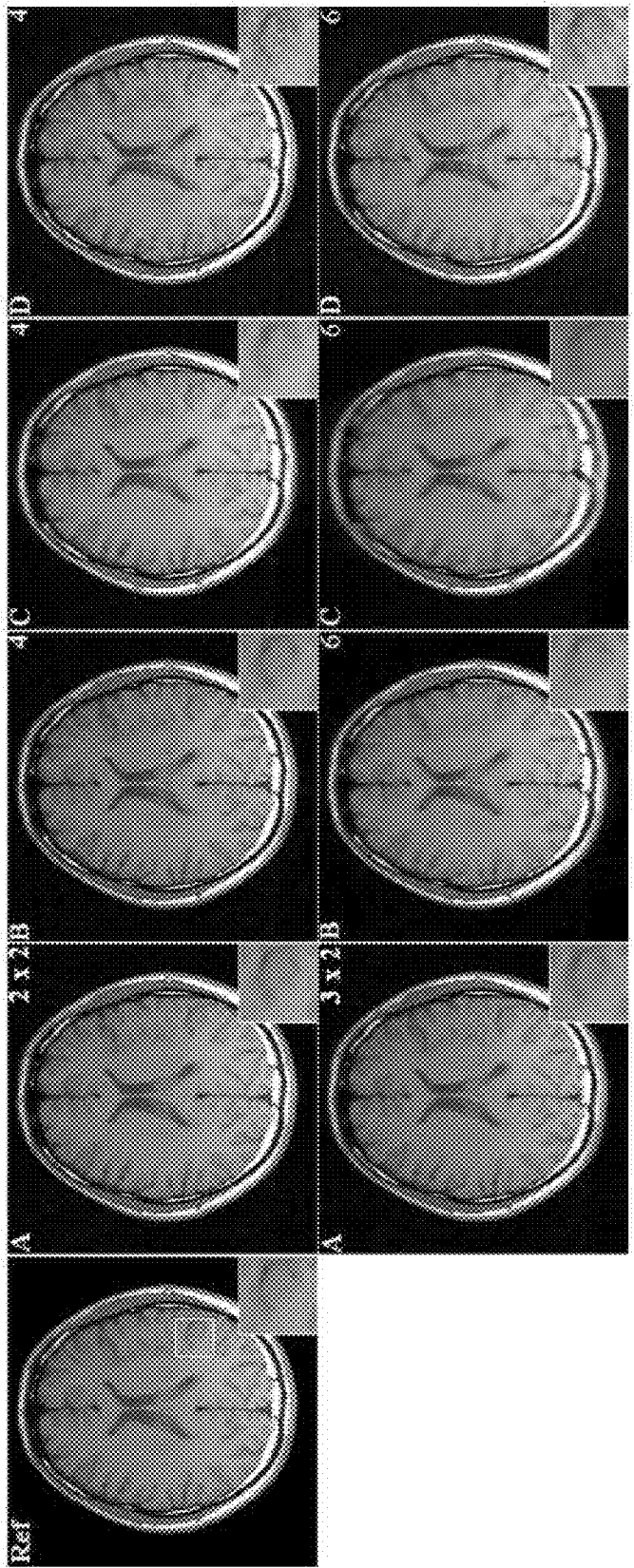
FIG. 9 illustrates axial brain images reconstructed using CS-SENSE (A), SparseSENSE (B), SparseMRI followed by SoS (C), and VD-SENSE with $l_2$ regularization (D) from a set of scanned, eight-channel data having a variety of reduction factors.

FIG. 9 illustrates reconstructed axial brain images 320 having a zoomed-in region of interest ("ROI") provided in the bottom-right corner of each image. With the reduction factor, R, set to R=4, both CS-SENSE and SparseMRI generate reconstructed images that are visually similar to the reference image. However, unlike the phantom results, both CS-SENSE and SparseSENSE begin to lose resolution as the reduction factor, R, is increased, but the image generated using SparseSENSE is blurrier than the image reconstructed using CS-SENSE. The image reconstructed using SparseMRI followed by SoS has visible undersampling artifacts, and VD-SENSE generated the noisiest of the reconstructed images. As the reduction factor, R, is increased, all of the reconstructed images become blurrier and have visible undersampling artifacts.

Figure 10:
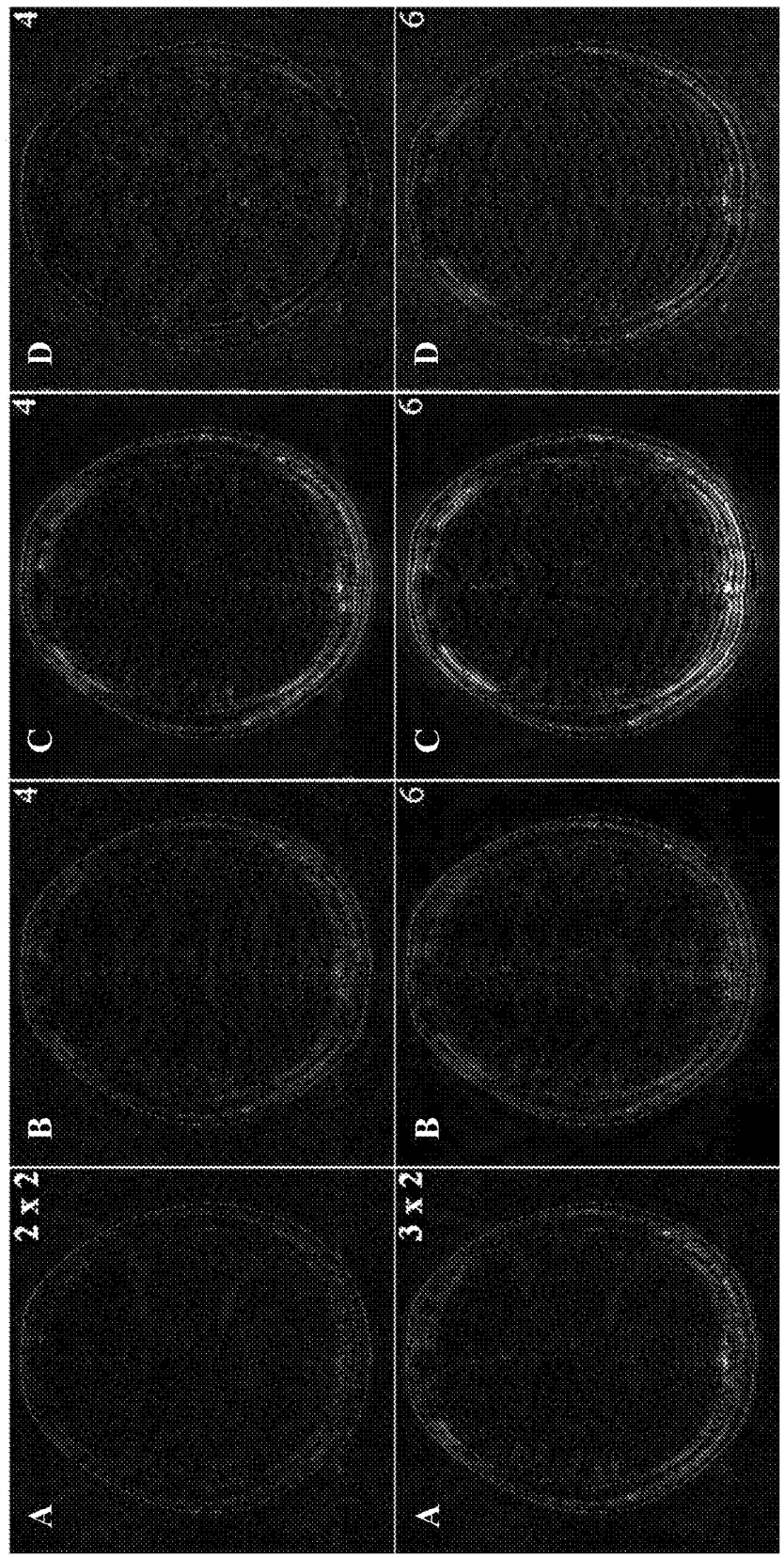
FIG. 10 illustrates error images corresponding to the reconstructed axial brain images of FIG. 9.

Error images 325, which show the amount of error in each of the reconstructed images in FIG. 9, are shown in FIG. 10. The bright areas at the edges of objects indicate a significant loss of resolution, and the structured ripples in the error images correspond to undersampling artifacts. By comparison, CS-SENSE preserves more detail with fewer undersampling artifacts than the other methods.

Figure 11:
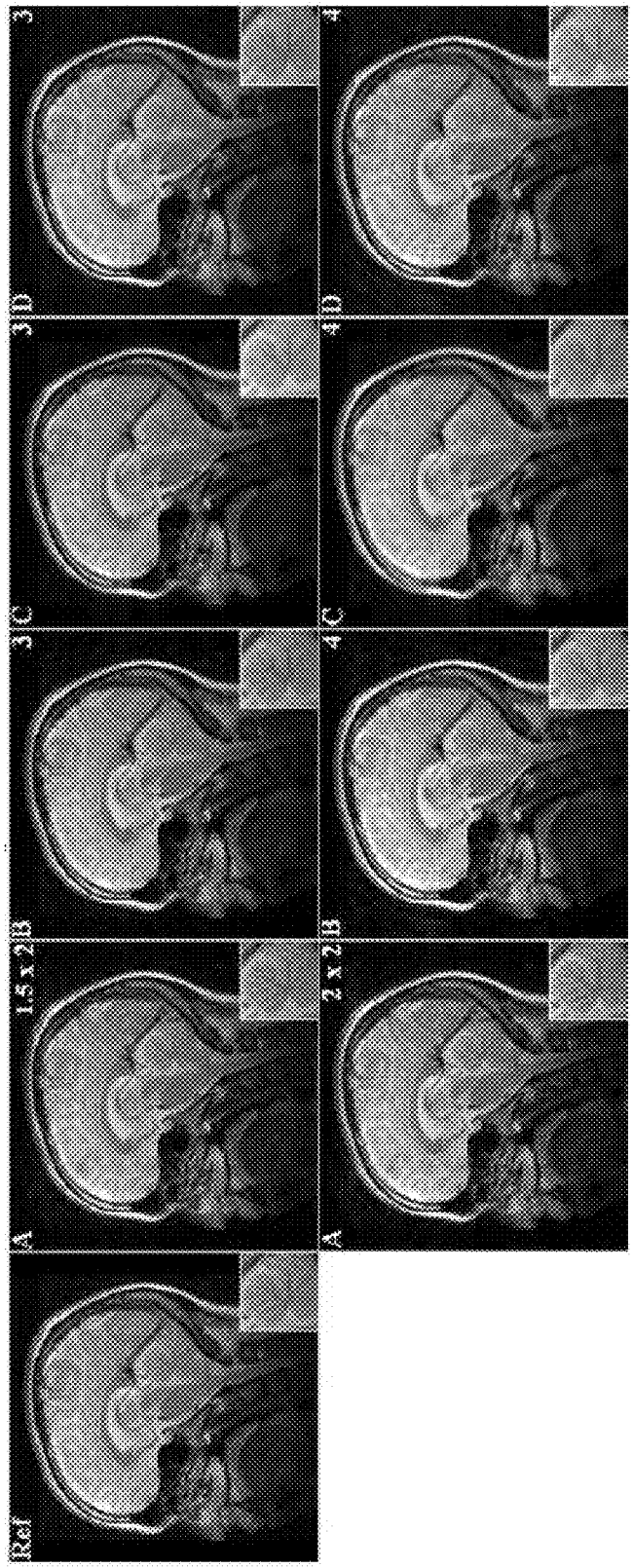
FIG. 11 illustrates sagittal brain images reconstructed using CS-SENSE (A), SparseSENSE (B), SparseMRI followed by SoS (C), and VD-SENSE with $l_2$ regularization (D) from a set of scanned, four-channel data having a variety of reduction factors.
Figure 12:
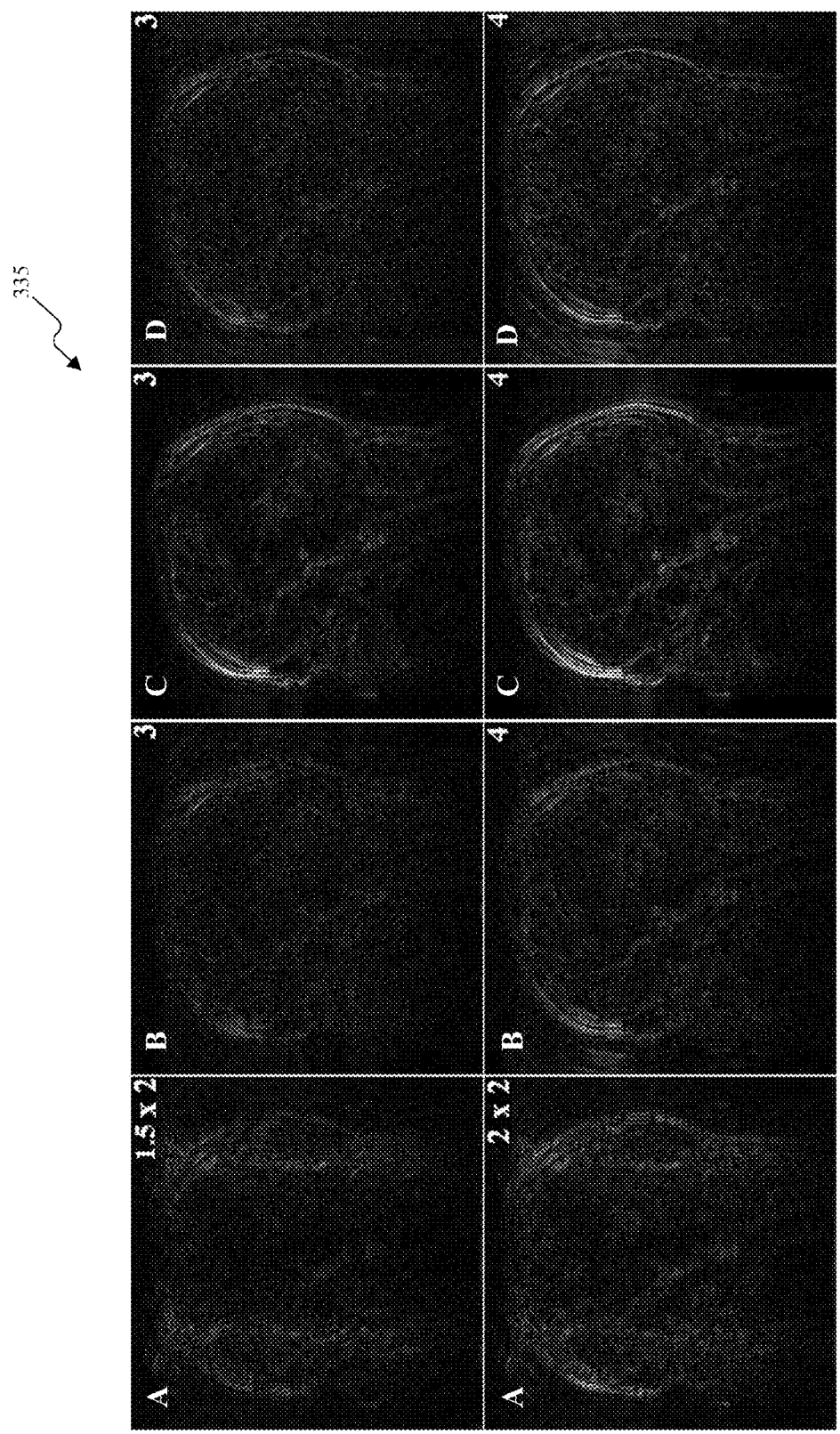
FIG. 12 illustrates error images corresponding to the reconstructed sagittal brain images of FIG. 11.

FIG. 11 illustrates reconstructed sagittal brain images 330 with a zoomed-in view of the cerebellum on the bottom-right corner of each image. As a result of the level of detail in the images, none of the reconstruction techniques are able to preserve the resolution with a reduction factor, R, set to R=3 or R=4, and each reconstructed image includes undersampling artifacts. Corresponding error images 335 for each of the images in FIG. 11 are shown in FIG. 12. The zoomed-in cerebellum shown in the bottom-right corner of each image shows that CS-SENSE is able to preserve more detail than the other methods.

By comparison, CS-SENSE preserves more detail than the other reconstruction techniques. With reference to the error images 335 of FIG. 12, the errors of CS-SENSE are a result of, among other things, spatial varying noise due to the noise amplification. The spatial varying noise results because a geometry factor ("g-factor") of the 4-channel data is larger than the g-factor for the 8-channel data, but the second reduction factor, $R_2$, for the SENSE step is the same.

The reconstructed in vivo images shown in FIGS. 9-12 demonstrate that CS-SENSE requires more measurements when the image to be constructed has more detail (i.e., is less compressible). Such a requirement is commensurate with the CS reconstruction error bounding provided by EQN. 7, which increases with the compression error.

Table #2 provides NMSEs (in percent) of the reconstructed axial and sagittal brain images for a variety of reduction factors and the reconstruction techniques described above with respect to FIGS. 9-12. CS-SENSE has the lowest NMSEs among the reconstruction techniques for each reduction factor and dataset.

TABLE #2

Reconstruction Error (%) Using in vivo Data

| | R Factor | | |
| --- | --- | --- | --- |
| | 1.5 × 2 | 2 × 2 | | 3 × 2 |
| Dataset | sagittal | sagittal | axial | axial |
| CS-SENSE | 0.62 | 0.91 | 0.25 | 0.83 |
| SparseSENSE | 0.65 | 1.13 | 0.59 | 1.06 |
| SparseMRI-SoS | 1.22 | 1.89 | 1.81 | 2.91 |
| VD-SENSE + $l_2$ | 0.82 | 1.41 | 0.69 | 1.51 |

Additionally, although a variety of the reconstruction techniques described herein use regularization, CS-SENSE only uses regularization in the CS step. When using regularization, there is a trade-off between the resolution of the reconstructed image and the suppression of undersampling artifacts and noise. Because CS-SENSE only uses regularization during the CS step, and the CS step only shares a fraction of the total reduction factor, R, the noise and undersampling artifacts are reduced while maintaining a large reduction factor. As a result, the resolution of CS-SENSE reconstructed images does not have to be compromised as much as other techniques where the total reduction factor is considered during regularization.

As previously described, CS-SENSE includes: (1) generating intermediate aliased images using SparseMRI; and (2) reconstructing the desired image from these aliased images using SENSE. When using SparseMRI, three primary factors affect the quality of reconstructed images having the same reduction factor: (1) an incoherence level; (2) measurement noise; and (3) the sparsity of the image following a sparsity transformation. The effects of different noise levels are described herein with respect to experimental results. The noise in a reconstructed image is only due to increases in measurement noise, but measurement noise does not introduce artifacts in the reconstructed image. The effects of image sparsity are described herein with respect to experimental results on phantom data and in vivo images. For very sparse phantom data, a reduction factor, R, of, for example, R=6-8 can be used to obtain a high-quality reconstructed image. For a moderately sparse image (e.g., an axial brain image) a reduction factor of approximately 4 can be achieved, and for an image with significant detail (e.g., a sagittal brain image), a reduction factor, R, of R=3 or less can be achieved. As such, images (e.g., in vivo images) which have a significant amount of detail require a greater number of measurements than do the more sparse phantom data sets. For example, brain images themselves are not sparse, but the brain images can be made sparse using a sparsifying transform, as described above. The sparsity of the images then depends on the sparsifying transform.

Figure 13:
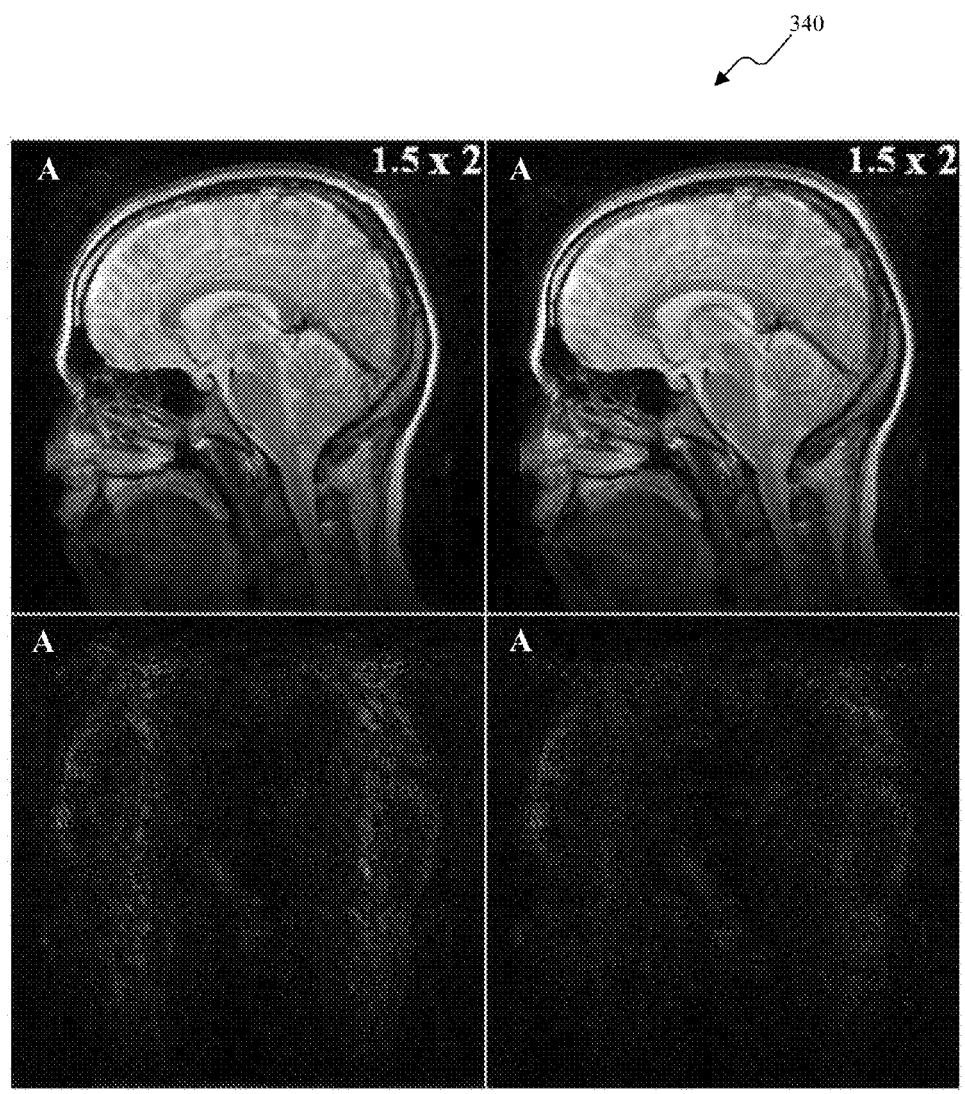
FIG. 13 illustrates CS-SENSE reconstructions of a sagittal brain image using sensitivity profiles estimated from 32 and 128 central encodings.

When using SENSE, two factors affect the quality of a reconstructed image: (1) the accuracy of the sensitivity profiles; and (2) the geometry factor ("g-factor"). Inaccurate sensitivity profiles cause aliasing artifacts in basic SENSE. As a result, CS-SENSE is subject to the same aliasing artifacts. As with SENSE, these artifacts can be reduced by improving the accuracy of channel sensitivities. As illustrated in FIG. 13, the quality and resolution of images 340 reconstructed using CS-SENSE improves when the sensitivity profiles are estimated using an increased number of channel encodings.

Noise and aliasing artifacts introduced by SparseMRI are propagated through to the SENSE reconstruction. In SENSE, a g-factor map is used to characterize the spatially dependent noise amplification. In CS-SENSE, the g-factor indicates the amplification of both noise and aliasing artifacts. Because the g-factor usually increases with the SENSE reduction factors, the propagation of errors is dependent on the size of the second reduction factor, $R_2$.

Figure 14:
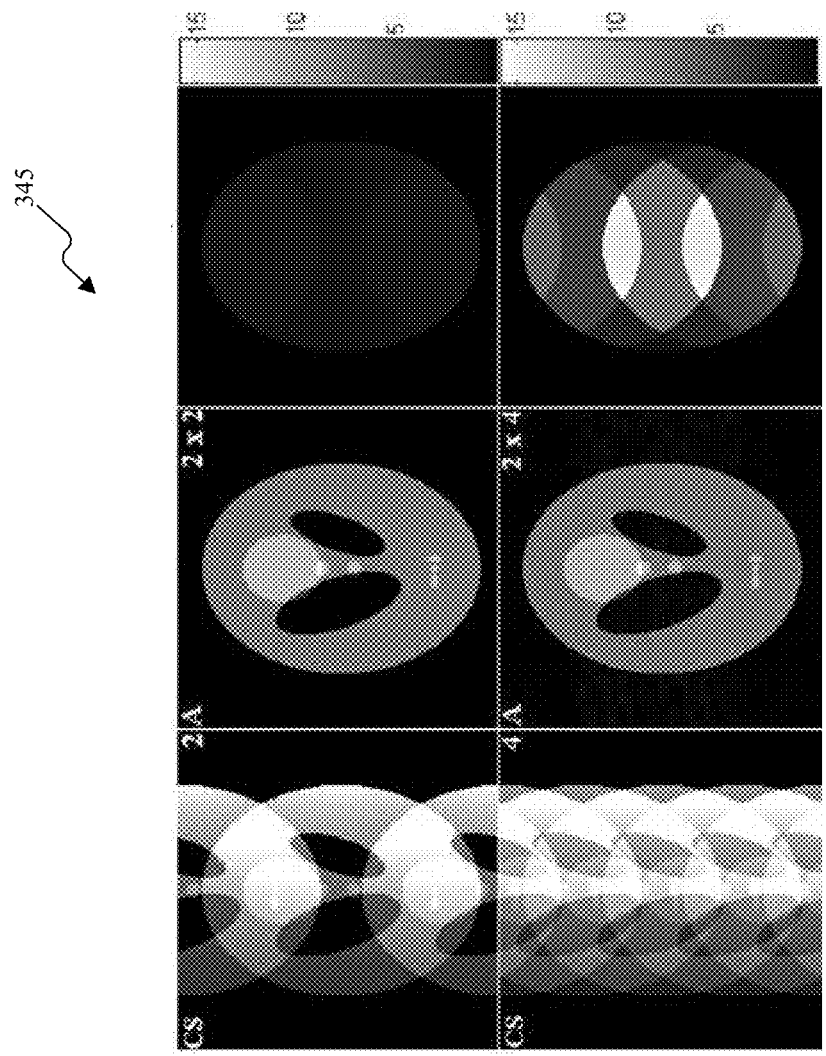
FIG. 14 illustrates SparseMRI reconstructed aliased images (left column) a final CS-SENSE reconstructions (middle column), and a geometry factor map of the SENSE step (right column).

FIG. 14 illustrates images 345 that demonstrate error propagation for $R_2=2$ and $R_2=4$ in the noise-free (i.e., SNR=∞) experimental results. Although the errors are undetectable in the aliased images with $R_1=2$, the errors are amplified by SENSE. Because the g-factor for $R_2=4$ is greater and more spatially non-uniform than the g-factor for $R_2=2$, the errors become more visible and non-uniformly distributed in the reconstructed image.

Figure 15:
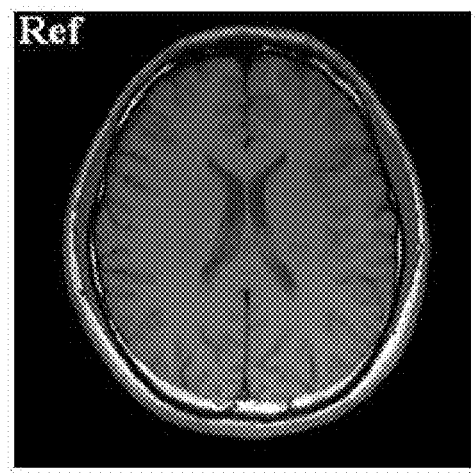
FIG. 15 illustrates a reference axial brain image.
Figure 16:
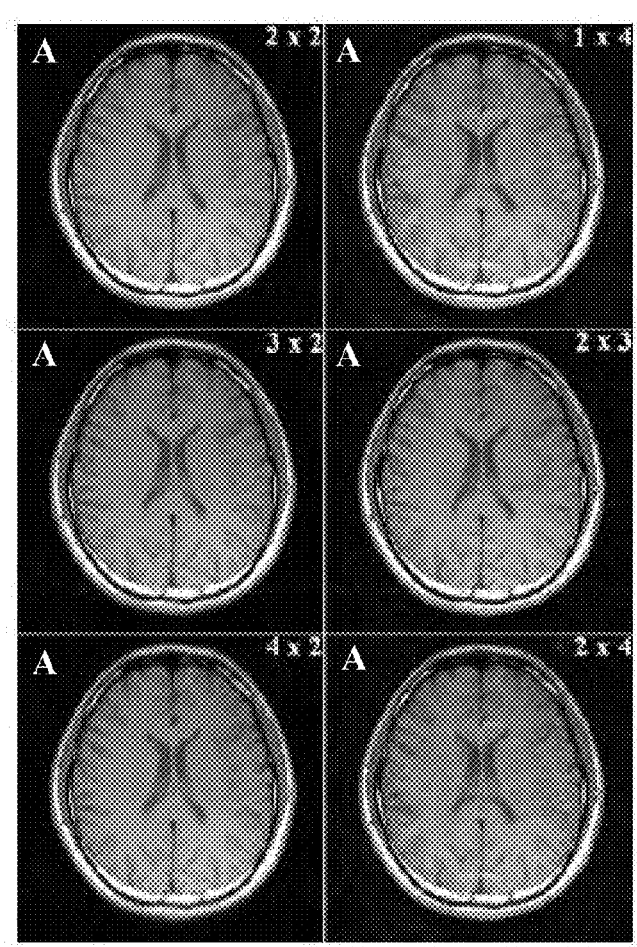
FIG. 16 illustrates CS-SENSE reconstructions of the axial brain image of FIG. 15 having a variety of combinations of reduction factors.

Due to the above-described error propagation, properly choosing the first and second reduction factors, $R_1$ and $R_2$, is important for generating high-quality reconstructed images. FIG. 15 illustrates a reference axial brain image 350, and FIG. 16 illustrates images 355 corresponding to various combinations of the first and second reduction factors, $R_1$ and $R_2$, used to achieve the same overall reduction factor, R. The combination of first and second reduction factors illustrated in FIG. 16 are R=4 (2×2, 1×4), R=6 (3×2, 2×3), and R=8 (4×2, 2×4). As a comparison, with a reduction factor of 8, SparseSENSE had an NMSE of 1.25%, while CS-SENSE had NMSEs of 1.04% and 1.17% for R=4×2 and R=2×4, respectively.

The images 355 of FIG. 16 demonstrate that a large $R_1$ (e.g. $R_1=4$) results in more artifacts than a small $R_1$ (e.g., $R_1=2$), and a large $R_2$ ($R_2=4$) results in larger error/noise amplification than a small $R_2$ (e.g., $R_2=2$). As such, when an image is sparse, a large first reduction factor, $R_1$, is used, and when the g-factor is small, a large second reduction factor, $R_2$, is used. The first and second reduction factors, $R_1$ and $R_2$, are also balanced to minimize the final reconstruction error.

In some embodiments, CS-SENSE requires more time to execute than SparseSENSE due to the number of computations required by each channel. For example, when reconstructing a brain image with a reduction factor, R, of R=4, CS-SENSE, SparseSENSE, SparseMRI, and VD-SENSE required approximately 183.6 s, 111.9 s, 240.4 s, and 55.9 s respectively. However, when CS-SENSE is implemented using a multiprocessor or dedicated hardware system for parallel computing, the time required to execute CS-SENSE is reduced. For example, because the k-space data are acquired from multiple channels simultaneously in pMRI, and reconstruction of the aliased images at each channel is independent, the SparseMRI procedure in CS-SENSE is able to be performed simultaneously for all channels. Thus the computational time of CS-SENSE is reduced to approximately the same amount of time required for VD-SENSE, and less than the time required for SparseSENSE. The additional computational time of Cartesian SENSE (e.g., approximately 3.9 s) is negligible compared to the iterative algorithms used for SparseMRI and is capable of being accelerated using graphics hardware.

In some embodiments, CS-SENSE uses $l_1$ minimization during CS reconstruction. In other embodiments, $l_p$ minimization (0<p<1) and approximated $l_0$ minimization are used during CS reconstruction to further reduce required computational time. In some embodiments, CS-SENSE instead utilizes correlations among aliased images. For example, aliased images from each channel share common sparse support in the sparsifying transform domain. In such embodiments, distributed compressed sensing ("DCS") is used for simultaneous reconstruction of multiple signals having intra- and inter-signal correlations. By using DCS algorithms, all aliased images with common sparse support may be simultaneously reconstructed using fewer samples. In other embodiments, the aliased images of all channels are reconstructed independently without taking advantage of their correlations. In some embodiments, the second reduction factor, $R_2$, for the SENSE step is held at approximately $R_2=2$ to limit noise amplification. Additionally or alternatively, regularization techniques suitable for Cartesian SENSE are used to implement a higher second reduction factor, $R_2$. In some embodiments, CS-SENSE is used for Cartesian trajectories. In other embodiments, CS-SENSE is used for non-Cartesian trajectories.

Thus, the invention provides, among other things, systems and methods for accelerating the acquisition and reconstruction of magnetic resonance images. Various features and advantages of the invention are set forth in the following claims.

What is claimed is:
1. A method of reconstructing magnetic resonance ("MR") images, the method comprising:
   obtaining a first set of data from a first receiver coil associated with an MR imaging device, the first set of data being a randomly undersampled subset of uniformly undersampled data;

generating a second set of data based on the first set of data, the second set of data being a set of uniformly undersampled data and being associated with a first reduced field-of-view ("FOV") image;

obtaining a third set of data from a second receiver coil associated with an MR imaging device, the third set of data also being a randomly undersampled subset of uniformly undersampled data;

generating a fourth set of data based on the third set of data, the fourth set of data also being a set of uniformly undersampled data and being associated with a second reduced FOV image;

generating a fifth set of data based on the second set of data and the fourth set, the fifth set of data being associated with a reconstructed full FOV image; and generating, using a processor associated with the MR imaging device, the reconstructed full FOV image based on the fifth set of data.

2. The method of claim 1, further comprising applying a sensitivity modulation to the first receiver coil and the second receiver coil.

3. The method of claim 1, further comprising
applying a convex optimization to the first set of data in order to generate the second set of data, and
applying a convex optimization to the third set of data in order to generate the fourth set of data.

4. The method of claim 1, further comprising applying a selected sampling pattern in order to obtain the first set of data.

5. The method of claim 4, wherein the sampling pattern is a random sampling pattern based on a compressed sensing.

6. A system configured for reconstructing magnetic resonance ("MR") images, the system comprising:
a processing unit associated with an MR imaging device, the processing unit configured to
obtain a first set of data from a first receiver coil associated with an MR imaging device, the first set of data being a randomly undersampled subset of uniformly undersampled data,
generate a second set of data based on the first set of data, the second set of data being a set of uniformly undersampled data and being associated with a first reduced field-of-view ("FOV") image,
obtain a third set of data from a second receiver coil associated with an MR imaging device, the third set of data also being a randomly undersampled subset of uniformly undersampled data,
generate a fourth set of data based on the third set of data, the fourth set of data also being a set of uniformly undersampled data and being associated with a second reduced FOV image,
generate a fifth set of data based on the second set of data and the fourth set of data, the fifth set of data being associated with a reconstructed full FOV image, and
generate the reconstructed full FOV image based on the fifth set of data.

7. The system of claim 6, wherein the processing unit is further configured in order to apply a sensitivity modulation to the first receiver coil and the second receiver coil.

8. The system of claim 6, wherein the processing unit is further configured in order to
apply a convex optimization to the first set of data in order to generate the second set of data, and
apply a convex optimization to the third set of data in order to generate the fourth set of data.

9. The system of claim 6, wherein the processing unit is further configured in order to apply a selected sampling pattern in order to obtain the first set of data.

10. The system of claim 9, wherein the sampling pattern is a random sampling pattern based on a compressed sensing.

11. A method of magnetic resonance ("MR") image reconstruction configured for use with an MR imaging device, the method comprising:
(a) randomly undersampling uniformly undersampled signals from each of a plurality of receiver coils based on compressed sensing in order to generate a first set of data;
(b) applying a convex optimization to the first set of data in order to generate a second set of data, the second set of data being associated with a uniformly undersampled reduced field-of-view ("FOV") image from each of the plurality of receiver coils;
(c) applying a parallel magnetic resonance imaging ("pMRI") reconstruction to the second set of data in order to generate a third set of data, the third set of data being associated with a reconstructed full FOV image; and
(d) generating, using a processor associated with the MR imaging device, the reconstructed full FOV image based on the third set of data.

12. The method of claim 11, wherein the plurality of receiver coils includes eight receiver coils.

13. The method of claim 11, wherein an overall data reduction factor associated with the reconstructed full FOV image is a product of a first reduction factor resulting from sampling signals from each of the plurality of receiver coils based on a compressed sensing and a second reduction factor resulting from applying the pMRI reconstruction.

14. A system configured for reconstructing magnetic resonance ("MR") images, the system comprising:
a processing unit associated with an MR imaging device, the processing unit configured to
(a) randomly undersample uniformly undersampled signals from each of a plurality of receiver coils based on compressed sensing in order to generate a first set of data,
(b) apply a convex optimization to the first set of data in order to generate a second set of data, the second set of data being associated with a uniformly undersampled, reduced field-of-view ("FOV") image from each of the plurality of receiver coils,
(c) apply a parallel magnetic resonance imaging ("pMRI") reconstruction to the second set of data in order to generate a third set of data, the third set of data being associated with a reconstructed full FOV image, and
(d) generate the reconstructed full FOV image based on the third set of data.

15. The system of claim 14, wherein the plurality of receiver coils includes eight receiver coils.

16. The system of claim 14, wherein an overall data reduction factor associated with the reconstructed full FOV image is a product of a first reduction factor resulting from sampling signals from each of the plurality of receiver coils based on a compressed sensing and a second reduction factor resulting from applying the pMRI reconstruction.

* * * * *